(12) United States Patent
Yu et al.

(10) Patent No.: US 11,289,343 B2
(45) Date of Patent: Mar. 29, 2022

(54) METHOD OF GAP FILLING USING CONFORMAL DEPOSITION-ANNEALING-ETCHING CYCLE FOR REDUCING SEAM VOID AND BENDING

(71) Applicant: Taiwan Semiconductor Manufacturing Company, Ltd., Hsinchu (TW)

(72) Inventors: De-Wei Yu, Ping-tung (TW); Chien-Hao Chen, Chuangwei Township (TW); Chia-Ao Chang, Jinhu Township (TW); Pin-Ju Liang, Changhua County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 2 days.

(21) Appl. No.: 16/593,181

(22) Filed: Oct. 4, 2019

(65) Prior Publication Data

US 2020/0035506 A1    Jan. 30, 2020

Related U.S. Application Data

(63) Continuation of application No. 15/720,087, filed on Sep. 29, 2017, now Pat. No. 10,504,747.

(51) Int. Cl.
*H01L 21/324* (2006.01)
*H01L 21/3205* (2006.01)
(Continued)

(52) U.S. Cl.
CPC .... *H01L 21/3247* (2013.01); *H01L 21/02532* (2013.01); *H01L 21/3065* (2013.01);
(Continued)

(58) Field of Classification Search
CPC ............ H01L 27/0924; H01L 29/0653; H01L 29/0847; H01L 29/66545; H01L 21/3065; H01L 21/823828; H01L 21/823878; H01L 21/3247; H01L 21/02532; H01L 21/32055; H01L 21/823418; H01L 21/823425;
(Continued)

(56) References Cited

U.S. PATENT DOCUMENTS 7,683,428 B2    3/2010  Chidambarrao et al.
9,165,837 B1   10/2015  Fronheiser et al.
(Continued)

FOREIGN PATENT DOCUMENTS

CN    101473426 A    7/2009
CN    105895506 A    8/2016
(Continued)

*Primary Examiner* — Ermias T Woldegeorgis
(74) *Attorney, Agent, or Firm* — Slater Matsil, LLP

(57) ABSTRACT

A method includes depositing a silicon layer, which includes first portions over a plurality of strips, and second portions filled into trenches between the plurality of strips. The plurality of strips protrudes higher than a base structure. The method further includes performing an anneal to allow parts of the first portions of the silicon layer to migrate toward lower parts of the plurality of trenches, and performing an etching on the silicon layer to remove some portions of the silicon layer.

20 Claims, 27 Drawing Sheets

(51) Int. Cl.
*H01L 21/8234* (2006.01)
*H01L 21/8238* (2006.01)
*H01L 21/02* (2006.01)
*H01L 21/3065* (2006.01)
*H01L 27/092* (2006.01)
*H01L 29/06* (2006.01)
*H01L 29/08* (2006.01)
*H01L 29/66* (2006.01)

(52) U.S. Cl.
CPC ............ *H01L 21/32055* (2013.01); *H01L 21/823418* (2013.01); *H01L 21/823425* (2013.01); *H01L 21/823431* (2013.01); *H01L 21/823481* (2013.01); *H01L 21/823821* (2013.01); *H01L 27/0924* (2013.01); *H01L 29/0653* (2013.01); *H01L 29/0847* (2013.01); *H01L 29/66545* (2013.01); *H01L 21/0245* (2013.01); *H01L 21/0262* (2013.01); *H01L 21/02381* (2013.01); *H01L 21/02428* (2013.01); *H01L 21/823437* (2013.01); *H01L 21/823814* (2013.01); *H01L 29/665* (2013.01)

(58) Field of Classification Search
CPC ..... H01L 21/823431; H01L 21/823481; H01L 21/823821; H01L 21/02381; H01L 21/02428; H01L 21/0245; H01L 21/0262; H01L 21/823437; H01L 21/823814; H01L 29/665
See application file for complete search history.

(56) References Cited

U.S. PATENT DOCUMENTS

| | | | |
|---|---|---|---|
| 9,461,044 | B1 | 10/2016 | Chang et al. |
| 9,574,284 | B2 | 2/2017 | Chiba et al. |
| 9,640,423 | B2 | 5/2017 | Krishnan et al. |
| 2007/0298585 | A1* | 12/2007 | Lubomirsky ..... H01L 21/76229 438/435 |
| 2012/0001239 | A1 | 1/2012 | Ko et al. |
| 2014/0264607 | A1 | 9/2014 | Basu et al. |
| 2015/0056791 | A1 | 2/2015 | Onodera et al. |
| 2015/0364574 | A1 | 12/2015 | Kim et al. |
| 2016/0020094 | A1 | 1/2016 | Van Aerde et al. |
| 2016/0315174 | A1 | 10/2016 | Basker et al. |
| 2017/0033178 | A1 | 2/2017 | Krishnan et al. |
| 2017/0162383 | A1* | 6/2017 | Li .................. H01L 21/823431 |
| 2017/0178976 | A1 | 6/2017 | Kanakasabapathy et al. |
| 2017/0213892 | A1 | 7/2017 | Dasgupta et al. |
| 2019/0172723 | A1* | 6/2019 | Cheng .............. H01L 21/02592 |

FOREIGN PATENT DOCUMENTS

| | | |
|---|---|---|
| CN | 107068754 A | 8/2017 |
| EP | 2975635 A1 | 1/2016 |
| JP | 2007520883 A | 7/2007 |
| KR | 20150144192 A | 12/2015 |
| KR | 20160101864 A | 8/2016 |

* cited by examiner

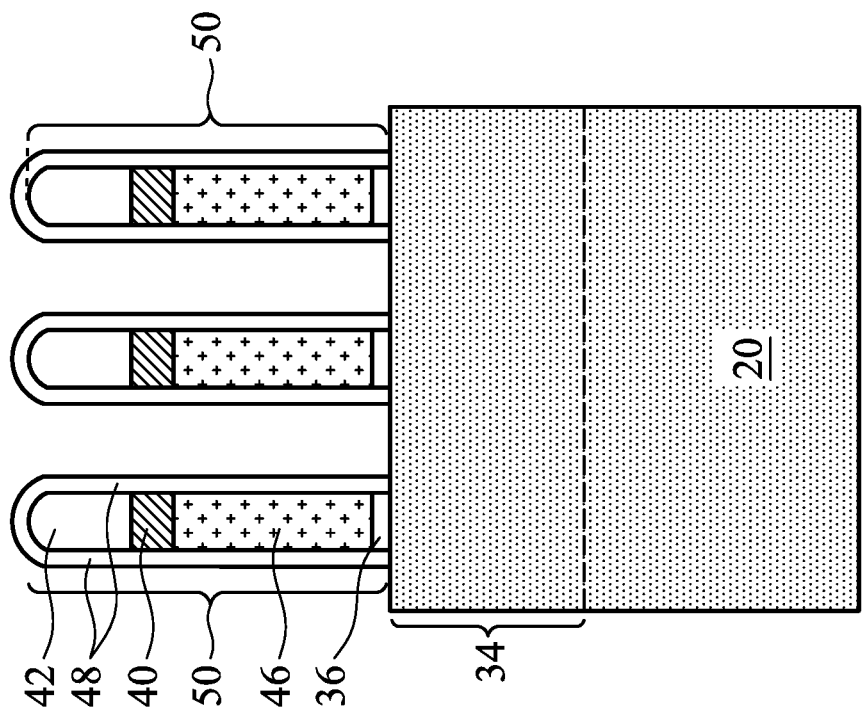
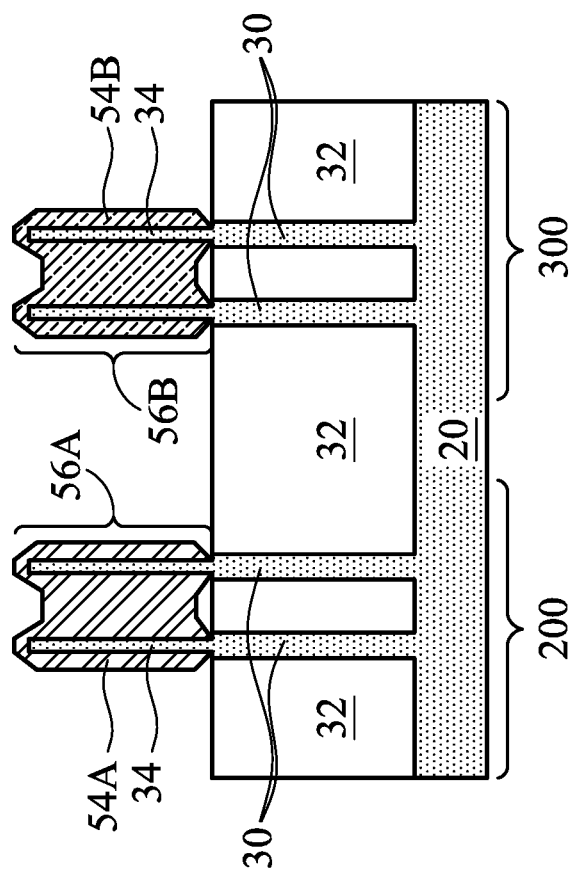
FIG. 9A
FIG. 9B

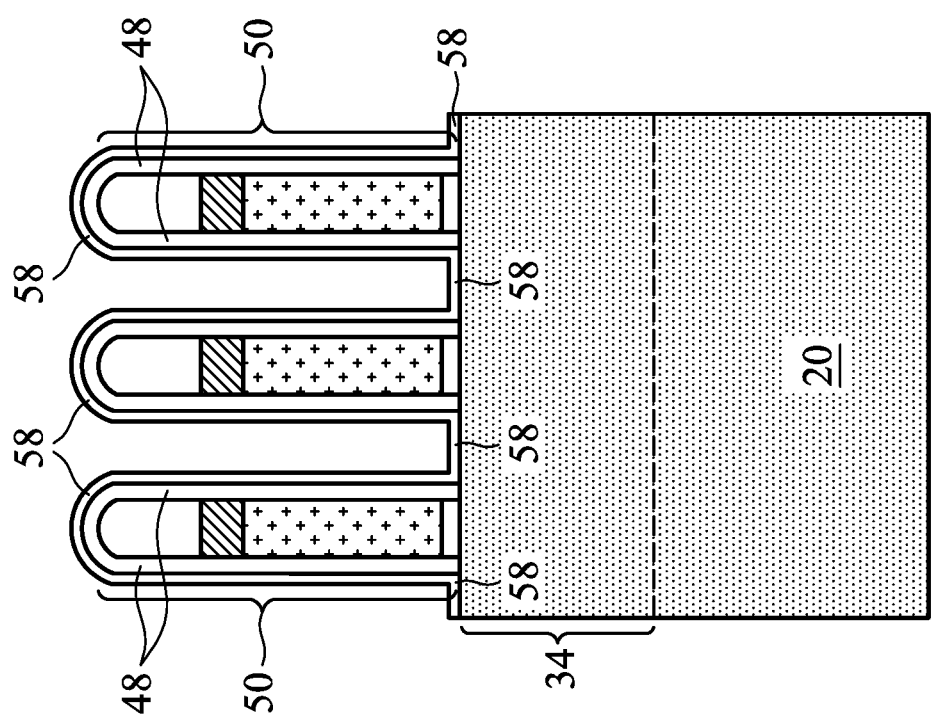
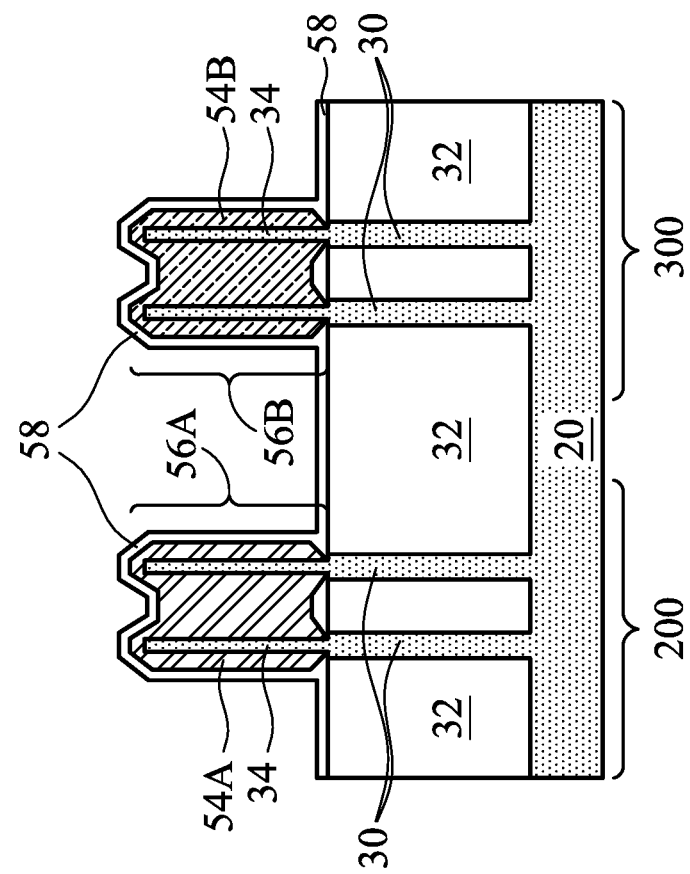
FIG. 10A
FIG. 10B

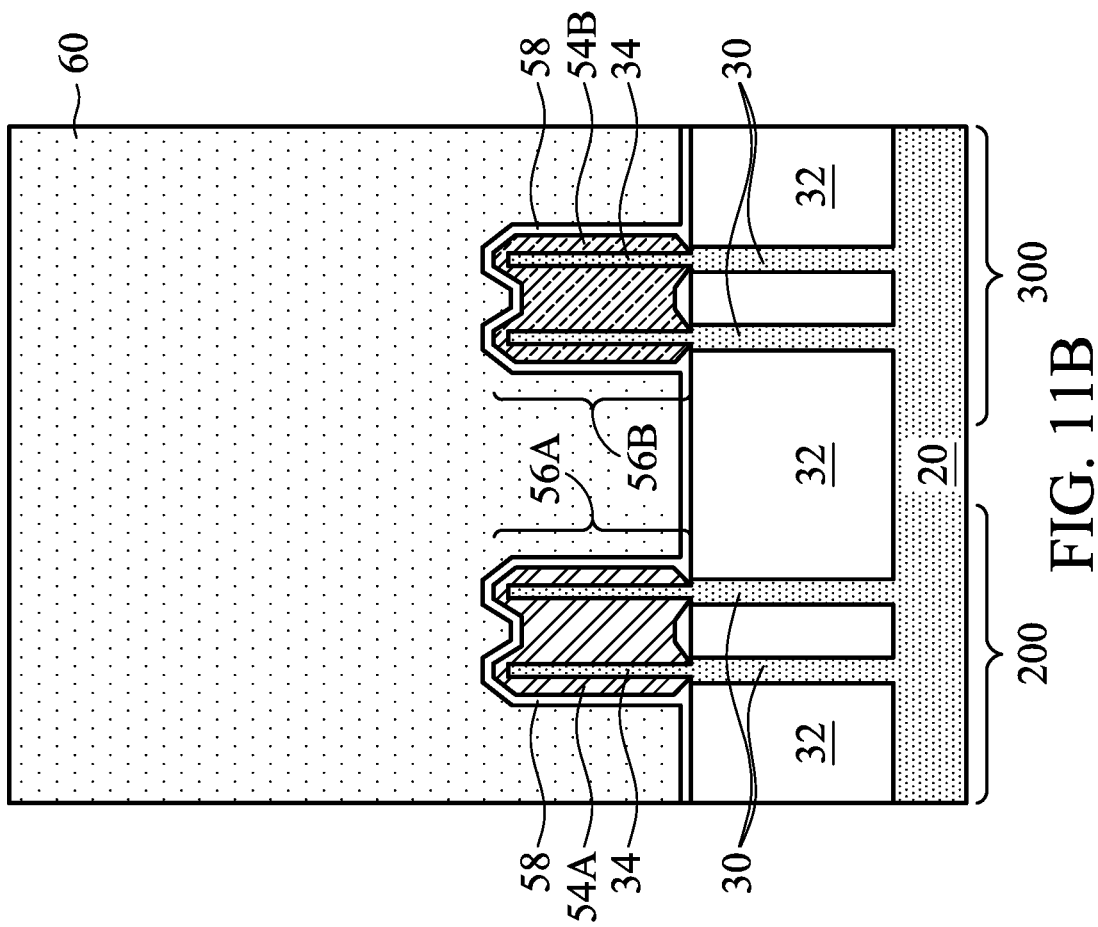
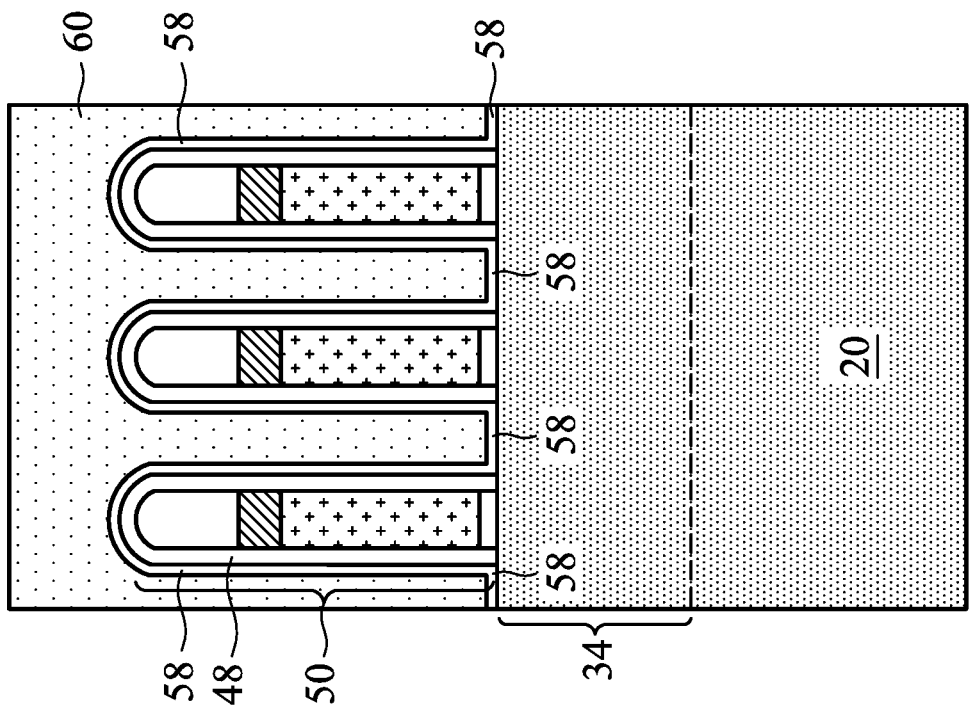
FIG. 11A
FIG. 11B

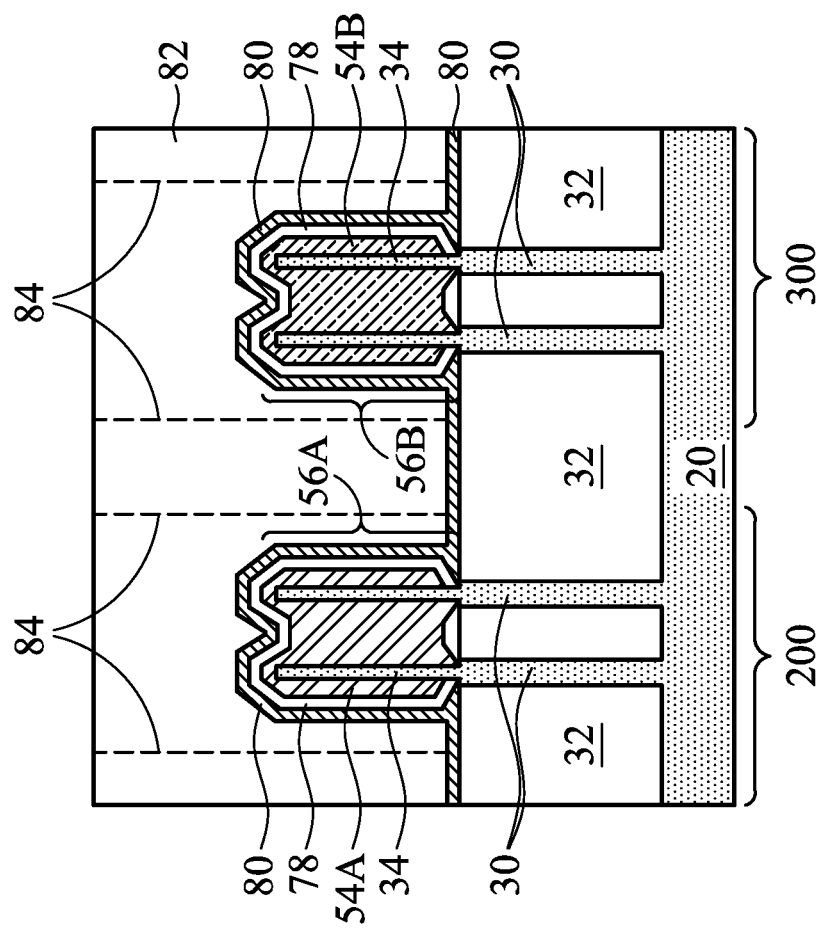
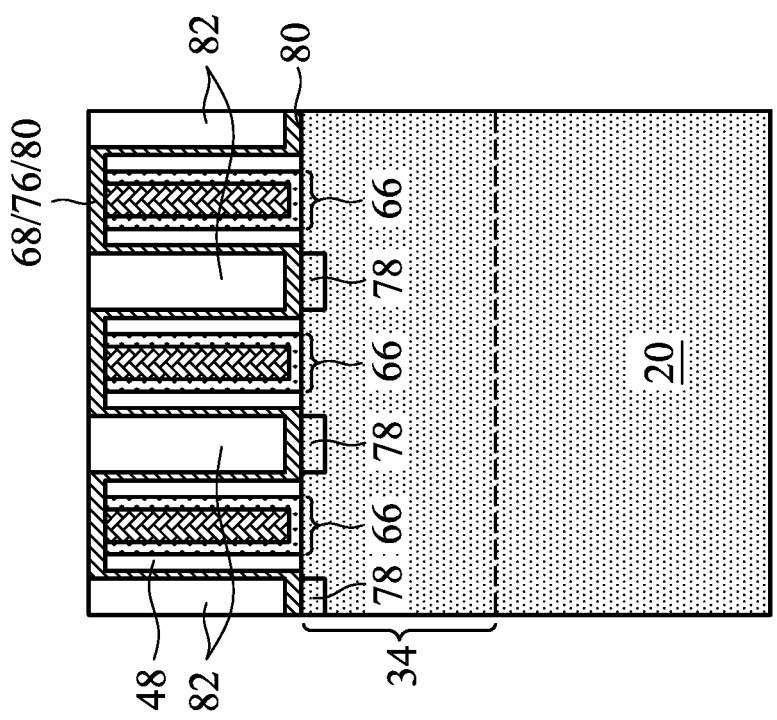
FIG. 20B
FIG. 20A

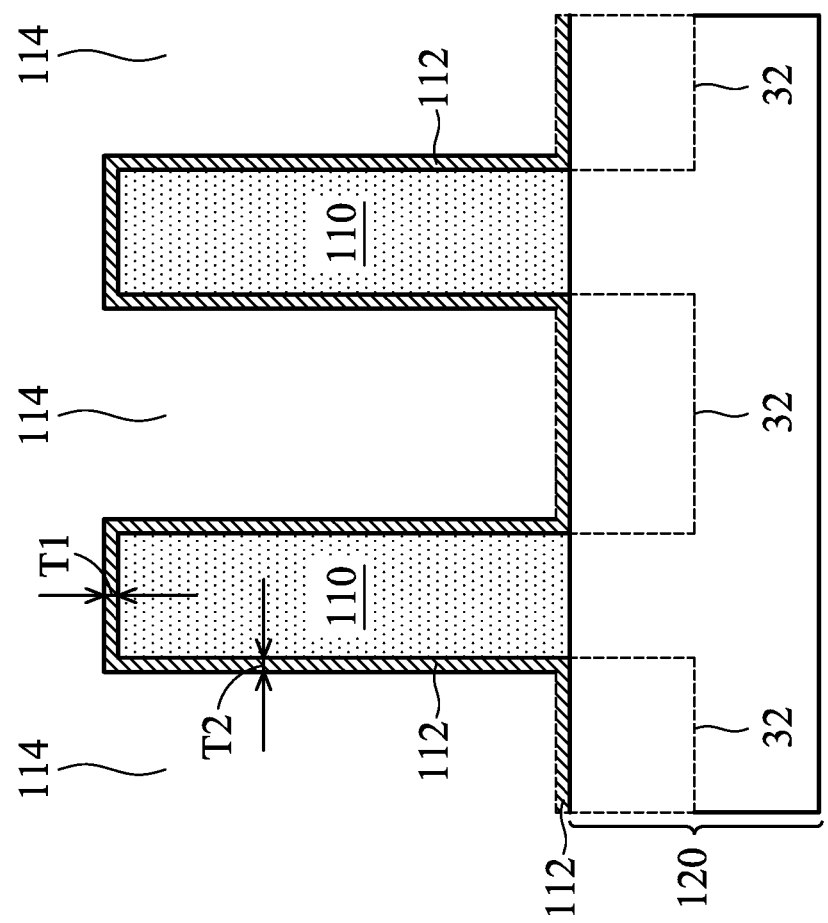

METHOD OF GAP FILLING USING CONFORMAL DEPOSITION-ANNEALING-ETCHING CYCLE FOR REDUCING SEAM VOID AND BENDING

PRIORITY CLAIM AND CROSS-REFERENCE

This application is a continuation of U.S. patent application Ser. No. 15/720,087, entitled "Method of Gap Filling Using Conformal Deposition-Annealing-Etching Cycle for Reducing Seam Void and Bending," filed on Sep. 29, 2017, which application is incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20A and 20B are perspective views and cross-sectional views of intermediate stages in the formation of Fin Field-Effect Transistors (FinFETs) in accordance with some embodiments.

FIGS. 21 through 28 illustrate the cross-sectional views of intermediate stages in a gap-filling process in accordance with some embodiments.

DETAILED DESCRIPTION

Figure 2:
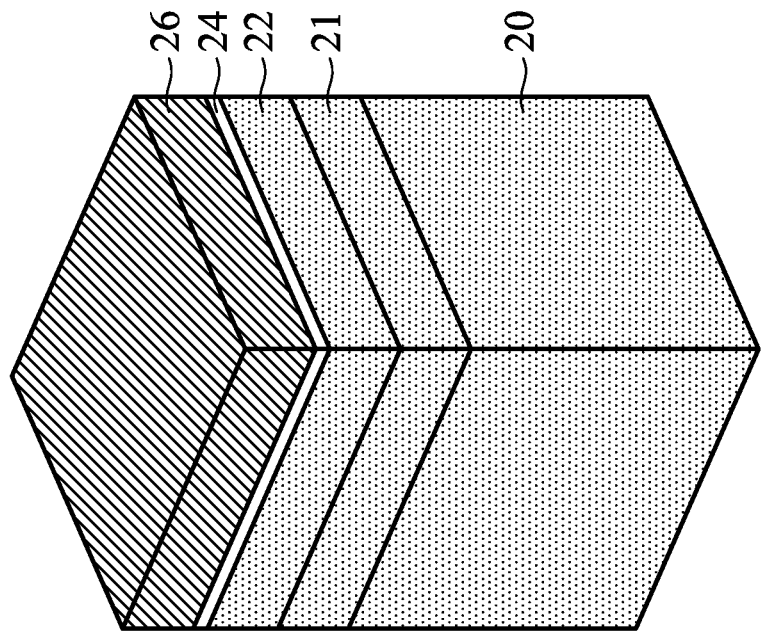

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. Some exemplary gap-filling processes are discussed. The intermediate stages of forming the FinFETs are illustrated. Some variations of some embodiments are discussed. Throughout the various views and illustrative embodiments, like reference numbers are used to designate like elements.

Figure 29:
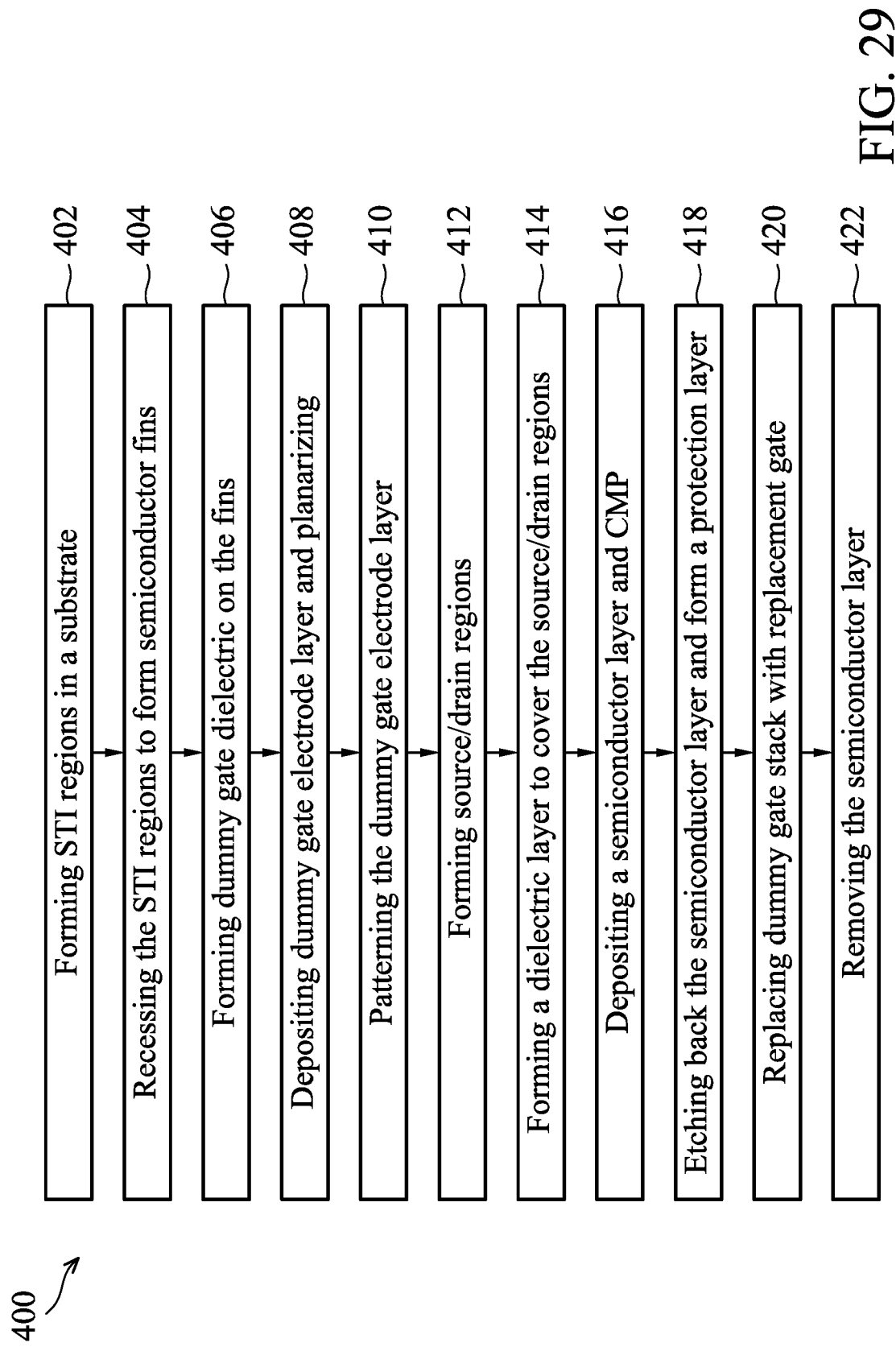
FIG. 29 illustrates a process flow for forming FinFETs in accordance with some embodiments.

FIGS. 1 through 20A and 20B illustrate the perspective views and cross-sectional views of intermediate stages in the formation of FinFETs in accordance with some embodiments. The processes shown in FIG. 1 through FIGS. 20A and 20B are also illustrated schematically in the process flow 400 as shown in FIG. 29.

Figure 1:
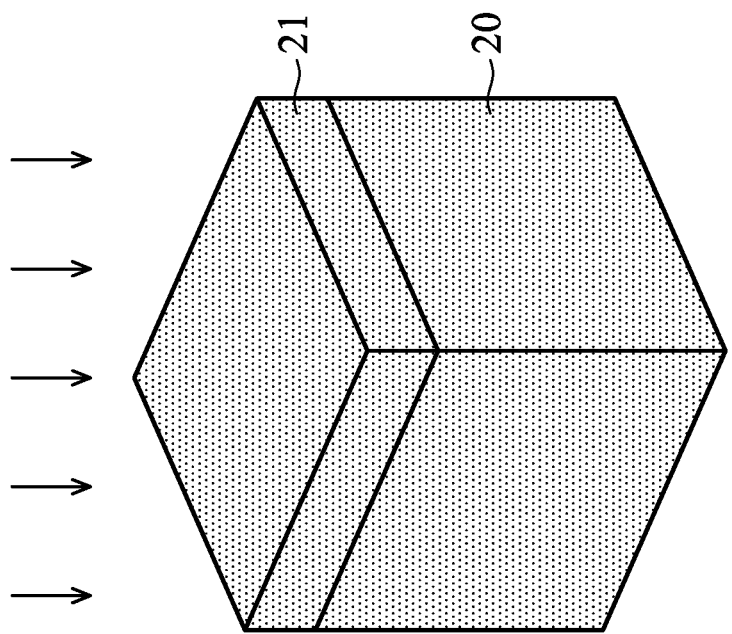

FIG. 1 illustrates a perspective view of substrate 20, which may be a part of a wafer. Substrate 20 may be a semiconductor substrate, such as a silicon substrate, a silicon carbon substrate, a silicon-on-insulator substrate or a substrate formed of other semiconductor materials. Substrate 20 may be lightly doped with a p-type or an n-type impurity. An Anti-Punch-Through (APT) implantation (illustrated by arrows) may be performed on a top portion of substrate 20 to form APT region 21. The conductivity type of the dopants implanted during the APT implantation is opposite to that of the source/drain region (not shown) of the respective FinFET to be formed. APT layer 21 extends under the subsequently formed source/drain regions in the resulting FinFET, which will be formed in subsequent processes, and is used to reduce the leakage from the source/drain regions to substrate 20. The doping concentration in APT layer 21 may be in the range between about $1E18/cm^3$ and about $1E19/cm^3$ in accordance with some exemplary embodiments. For simplicity, in subsequent drawings, APT region 21 may not be illustrated.

Referring to FIG. 2, epitaxy semiconductor layer 22 is grown on substrate 20 through epitaxy. Throughout the description, epitaxy semiconductor layer 22 and substrate 20 in combination are also be referred to as a semiconductor substrate. Epitaxy semiconductor layer 22 may include silicon germanium (SiGe), silicon carbon, or silicon (free from germanium and carbon). When formed of SiGe, the germanium percentage (atomic percentage) of epitaxy semiconductor layer 22 may be in the range between about 25 percent and about 35 percent, while higher or lower germanium percentages may be used. It is appreciated, however, that the values recited throughout the description are examples, and may be changed to different values.

Pad oxide 24 and hard mask 26 are formed over epitaxy semiconductor layer 22. In accordance with some embodiments of the present disclosure, pad oxide 24 is formed of silicon oxide, which may be formed by oxidizing a surface layer of semiconductor layer 22. Hard mask 26 may be formed of silicon nitride, silicon oxynitride, silicon carbide, silicon carbo-nitride, or the like.

Figure 3:
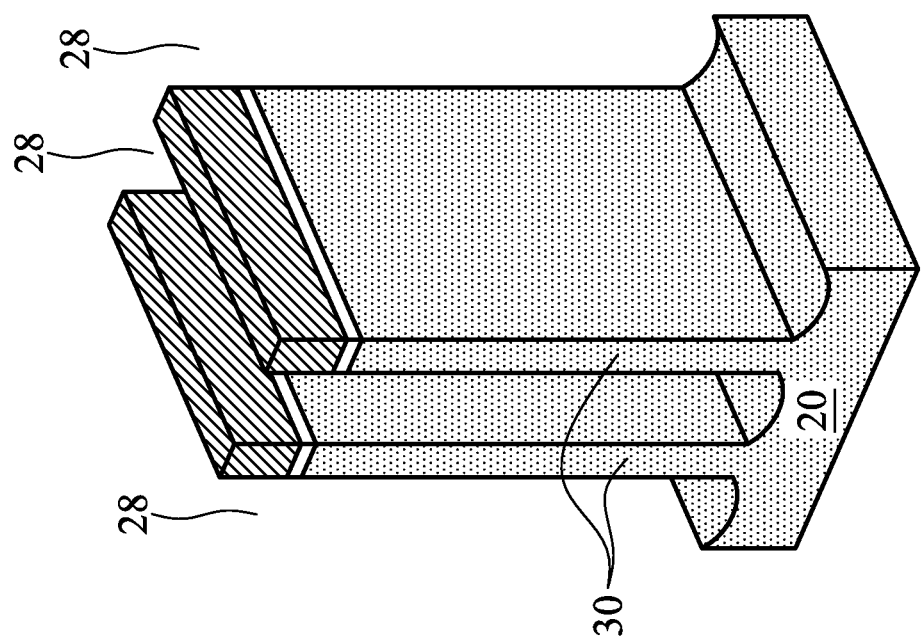

Next, as shown in FIG. 3, hard mask 26, pad oxide 24, semiconductor layer 22, and substrate 20 are patterned in an etching process to form trenches 28. Accordingly, semiconductor strips 30 are formed. Trenches 28 extend into semiconductor layer 22 and substrate 20, and have lengthwise directions parallel to each other.

Figure 4:
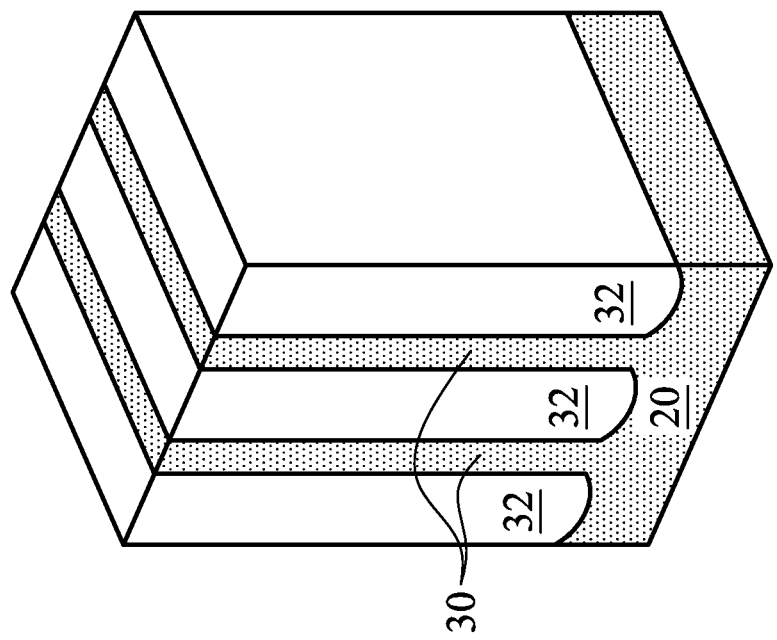

Next, as shown in FIG. 4, isolation regions 32, which are alternatively referred to as Shallow Trench Isolation (STI) regions, are formed in trenches 28 (FIG. 3). The respective process is illustrated as process 402 in the process flow shown in FIG. 29. The formation of STI regions 32 may include filling trenches 28 with a dielectric layer(s), for example, using Flowable Chemical Vapor Deposition (FCVD). A planarization such as Chemical Mechanical Polish (CMP) and mechanical polish is then performed to level the top surface of the dielectric material with the top surface of hard mask 26 or the top surfaces of isolation regions 32. After the CMP, hard mask 26 and pad oxide 24 (FIG. 3) are removed.

Figure 5:
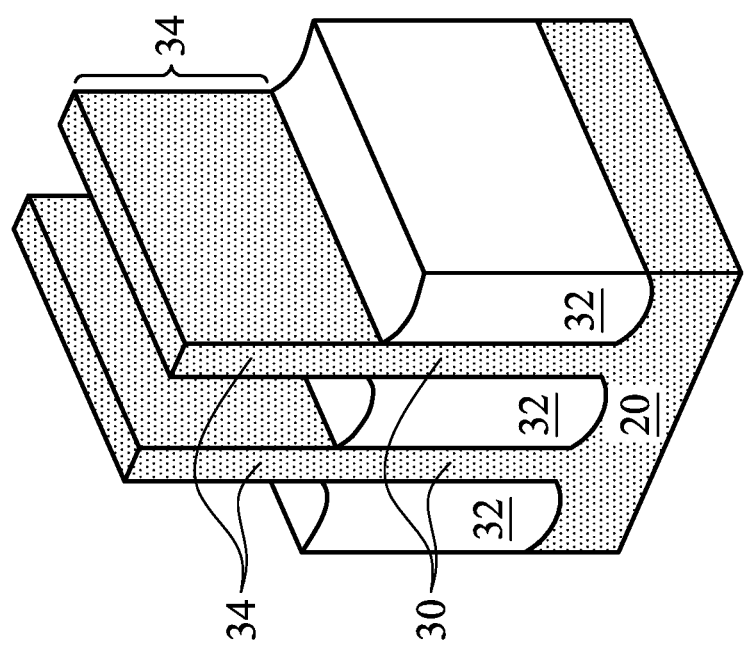

Next, referring to FIG. 5, STI regions 32 are recessed, so that the top surfaces of the resulting STI regions 32 are lower than the top surface of semiconductor strips 30. The respective process is illustrated as process 404 in the process flow shown in FIG. 29. Throughout the description, the upper portions of semiconductor strips 30 (i.e., the upper portions that are higher than the top surfaces of STI regions 32) are referred to as semiconductor fins 34. The lower portions of semiconductor strips 30 lower than the top surfaces of STI regions 32 remain to be referred to as semiconductor strips 30.

Figure 6:
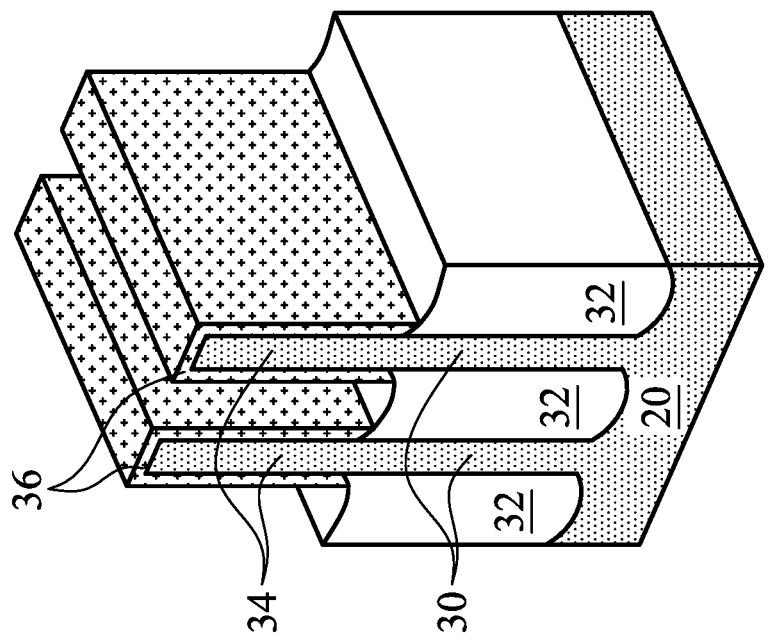

FIG. 6 illustrates the formation of dummy gate dielectric 36. Dummy gate dielectric 36 may include silicon oxide (and hence may be referred to as a gate oxide) in accordance with some embodiments. Dummy gate dielectric 36 may also be formed of other dielectric materials such as silicon nitride. The respective process is illustrated as process 406 in the process flow shown in FIG. 29. Dummy oxide 36 may be formed through deposition or oxidizing the surface layers of semiconductor fins 34. Accordingly, dummy oxide 36 may or may not extend on the top surfaces of STI regions 32. Dummy oxide 36 is also formed simultaneously as the gate dielectric of Input-output (IO) FinFETs.

Figure 7:
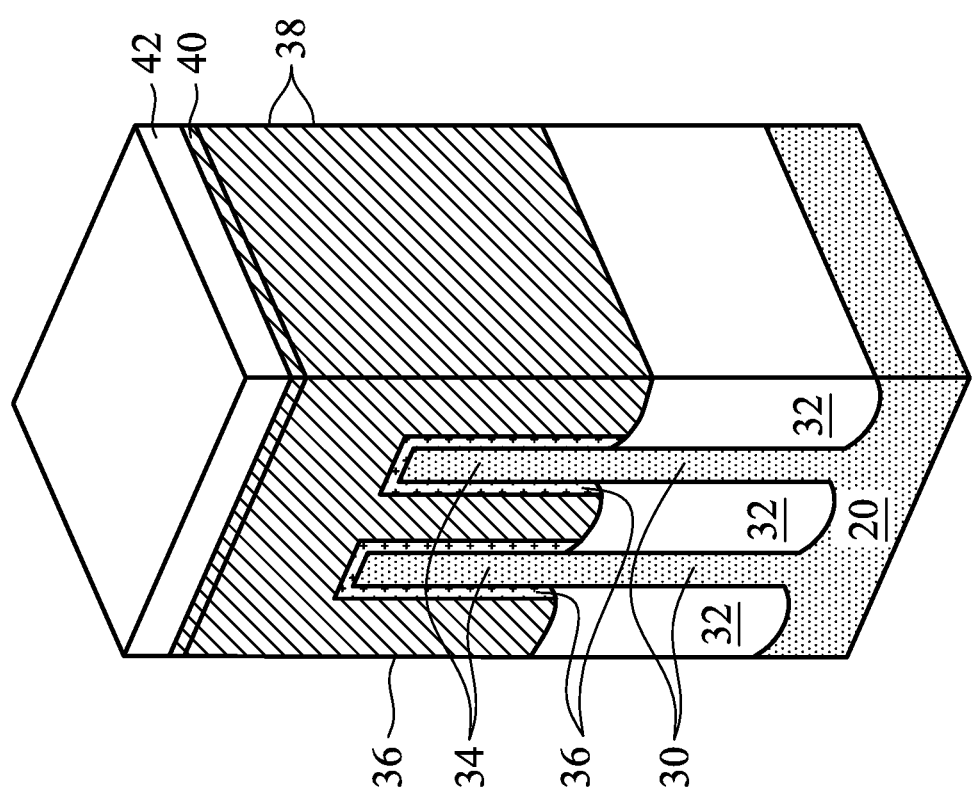

FIG. 7 illustrates the formation of dummy gate electrode layer 38, which is formed of polysilicon or amorphous silicon in accordance with some embodiments. Dummy gate electrode layer 38 is planarized. The respective process is illustrated as process 408 in the process flow shown in FIG. 29. An exemplary formation process of dummy gate electrode layer 38 is shown in detail in the process shown in FIGS. 21 through 28, and will be discussed in subsequent paragraphs. The resulting dummy gate electrode layer 38 is seam-free and void-free, and semiconductor fins 34 are bending-free.

As also shown in FIG. 7, hard mask 40 and hard mask 42 are formed. Hard mask 40 and hard mask 42 may be formed of materials selected from, and not limited to, silicon oxide, silicon nitride, silicon carbide, silicon oxynitride, silicon oxy-carbide, silicon oxy-carbo-nitride, and the like. In accordance with some embodiments of the present disclosure, hard mask 40 is formed of silicon nitride, and hard mask 42 is formed of silicon oxide.

Referring again to FIG. 8, hard mask 40 and hard mask 42 are patterned through etching. A photo resist (not shown) is used for defining the patterns of hard masks 40 and 42. The patterned hard masks 40 and 42 are used to further pattern dummy gate electrode layer 38 (FIG. 7), with the patterned hard masks 40 and 42 being used as an etching mask. The respective process is illustrated as process 410 in the process flow shown in FIG. 29. The etching of hard masks 40 and 42 and dummy gate electrode layer 38 are performed using anisotropic etching methods. The remaining portion of dummy gate electrode layer 38 is referred to as dummy gate electrode 46 hereinafter. The etchant gas is selected depending on the material of dummy gate electrode layer 38, and may include a mixture of chlorine ($Cl_2$) and nitrogen ($N_2$), a mixture of fluorine ($F_2$) and nitrogen ($N_2$), or a mixture of $NF_3$, $H_2$, and helium (He) when dummy gate electrode layer 38 is formed of polysilicon or amorphous silicon.

After the patterning of dummy gate electrode layer 38, the exposed portions of dummy oxide 36 that are not covered by dummy gate electrode 46 are removed in an etching process. In subsequent discussion, dummy oxide 36, dummy gate electrode 46, and hard masks 40 and 42 in combination are referred to as dummy gate stack 50.

FIGS. 9A and 9B through FIGS. 20A and 20B illustrate the cross-sectional views of intermediate stages in the formation of remaining portions of FinFETs in accordance with some embodiments of the present disclosure. In FIGS. 9A and 9B through 20A and 20B, the figure numbers include letter "A" or letter "B." The letter "A" indicates that the respective figure is a cross-sectional view obtained from the vertical planes same as the vertical plane containing line A-A in FIG. 8. The letter "B" indicates that the respective figures are obtained from the vertical planes same as the vertical plane containing line B-B in FIG. 8. Also, the device region as shown in the figures whose figure numbers having the letter "B" includes portions in device region 200 and portions in device region 300. Device region 200 is an n-type FinFET region, and device region 300 is a p-type FinFET region. The figures having the same digits and different letters indicate they are the different views of a same process. Furthermore, the gate structures as shown in the figures whose figure numbers having the letter "A" may be the actual gates (or dummy gates) of p-type FinFETs or n-type FinFETs.

Figure 8:
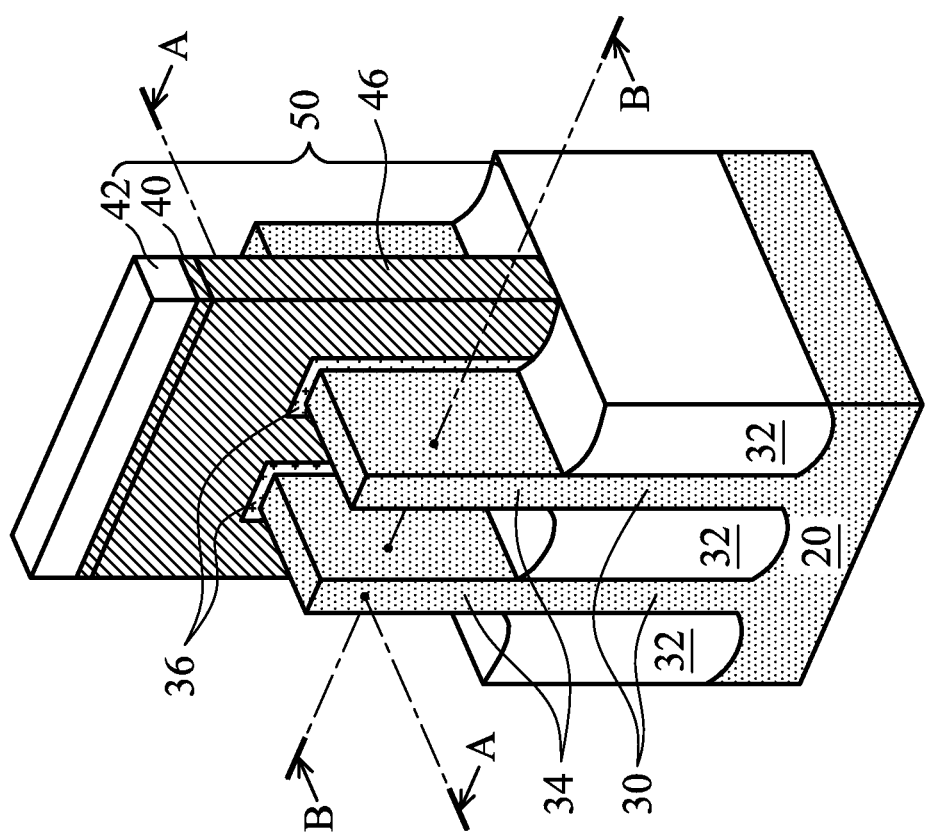

FIG. 9A illustrates a plurality of dummy gate stacks 50, which are strips when viewed from the top of FIG. 9A. Dummy gate stacks 50 extend on the sidewalls and the top surface of semiconductor fin 34, as is shown in FIG. 8. After the process as shown in FIG. 8, first gate spacers 48 are formed. First gate spacers 48 include portions on the sidewalls of dummy gate stacks 50. Although some subsequent figures show that gate spacers 48 include top portions overlapping dummy gate stacks 50, the top portions of gate spacers 48 may be removed, and may not exist in FIGS. 10A, 11A, and 12A.

FIG. 9B illustrates the formation of epitaxy semiconductor regions 54A and 54B in device regions 200 and 300, respectively. Source/drain regions 56A and 56B are also formed. The respective process is illustrated as process 412 in the process flow shown in FIG. 29. In accordance with some embodiments of the present disclosure, source/drain regions 56A and 56B are formed as cladding source/drain regions, as shown in FIG. 9B, in which epitaxy semiconductor regions 54A and 54B are epitaxially grown on the exposed protruding fins 34. Epitaxy regions 54A and 54B represent the epitaxy regions for forming different types of FinFETs. Depending on whether the resulting FinFET is a p-type FinFET or an n-type FinFET, a p-type or an n-type impurity may be in-situ doped with the proceeding of the epitaxy. For example, epitaxy regions 54A may include silicon phosphorous (SiP), silicon carbon phosphorous (SiCP), or the like, and the respective resulting FinFET is an n-type FinFET. Epitaxy regions 54B may include silicon germanium boron (SiGeB), SiB, or the like, and the resulting FinFET is a p-type FinFET. In accordance with alternative embodiments of the present disclosure, epitaxy regions 54A and/or 54B are formed of a III-V compound semiconductor such as GaAs, InP, GaN, InGaAs, InAlAs, GaSb, AlSb, AlAs, AlP, GaP, combinations thereof, or multi-layers thereof. When epitaxy regions 54A and 54B are formed of different materials, they are formed in different epitaxy processes, and the corresponding masks (not shown) are used to allow the epitaxy occurs on one of epitaxy regions 54A and 54B, but not on the other.

In accordance with alternatively embodiments, instead of directly growing epitaxy regions on protruding fins 34, an etching process (referred to as source/drain recessing hereinafter) is performed to etch the portions of protruding fins 34 that are not covered by dummy gate stack 50 and gate spacers 48, so that recesses are formed. Epitaxy regions 54A and 54B are then grown from the recesses.

An implantation process(es) may be performed to implant the desirable p-type or n-type impurity such as boron or phosphorous into protruding fins 34 and epitaxy regions 54A and 54B. The protruding fins 34 and the corresponding epitaxy regions 54A and 54B in combination are referred to as source/drain regions 56A and 56B, respectively. In accordance with alternative embodiments of the present disclosure, the implantation process is skipped when epitaxy regions 54A and 54B are in-situ doped with the p-type or n-type impurity.

FIGS. 10A and 10B illustrate the formation of dielectric layer 58, which is formed as a conformal layer on gate spacers 48, gate stacks 50, and source/drain regions 56A and 56B. The respective process is illustrated as process 414 in the process flow shown in FIG. 29. Dielectric layer 58 may be a silicon oxide layer, a silicon nitride layer, or the like, and may be formed using Low-Pressure Chemical Vapor Deposition (LPCVD), Atomic Layer Deposition (ALD), Chemical Vapor Deposition (CVD), or the like.

Referring to FIGS. 11A and 11B, semiconductor layer 60 is deposited. The respective process is illustrated as process 416 in the process flow shown in FIG. 29. In accordance with some embodiments of the present disclosure, semiconductor layer 60 includes an amorphous semiconductor or a poly semiconductor, which may include silicon, germanium, silicon germanium, or the like. The details of the formation process are shown in detail in FIGS. 21 through 28. Semiconductor layer 60 is deposited to a level higher than the top surfaces of gate stacks 50 and gate spacers 48.

Figure 12B:
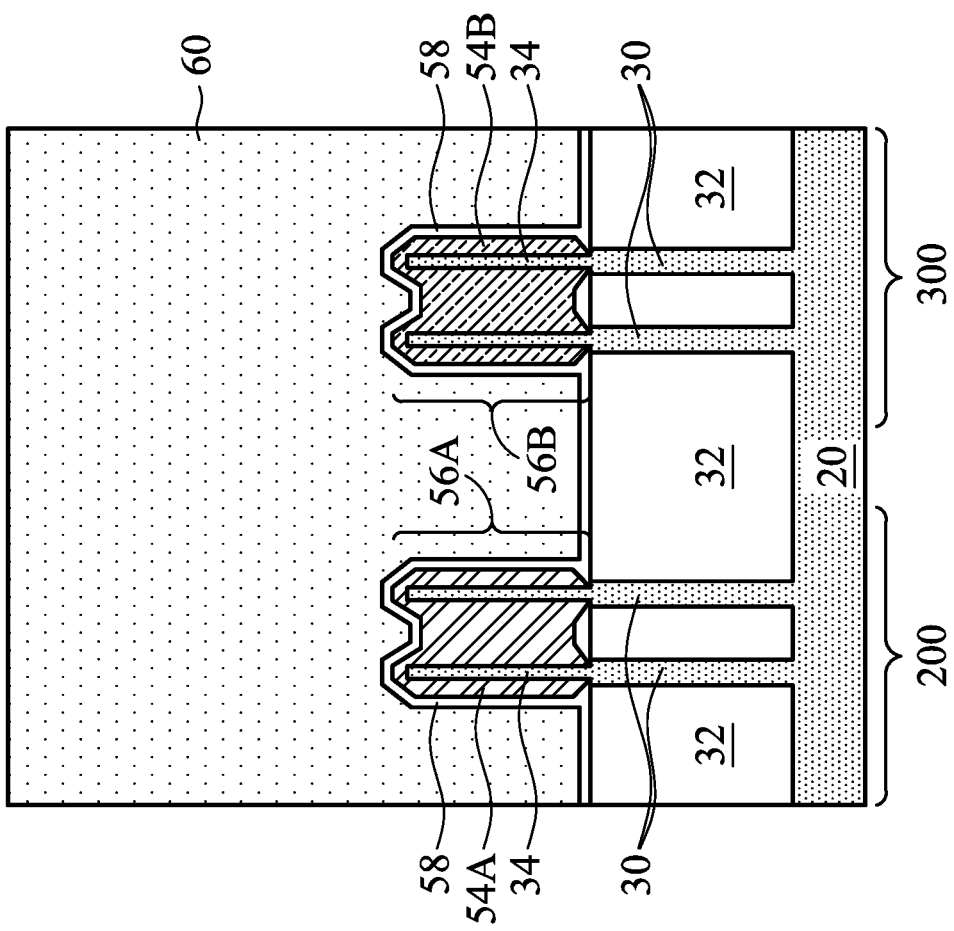
Figure 12A:
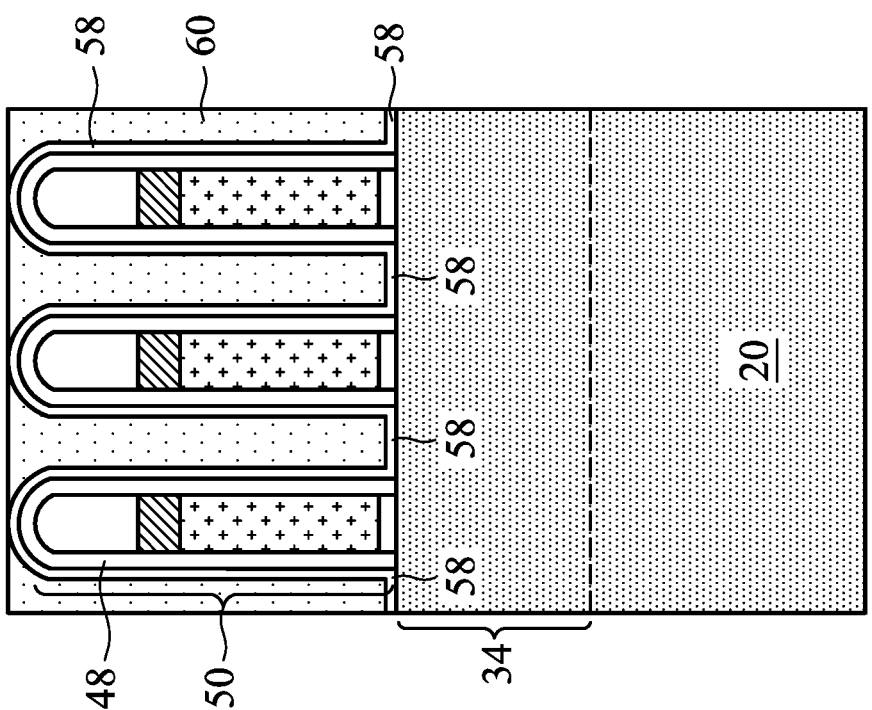
Figure 13B:
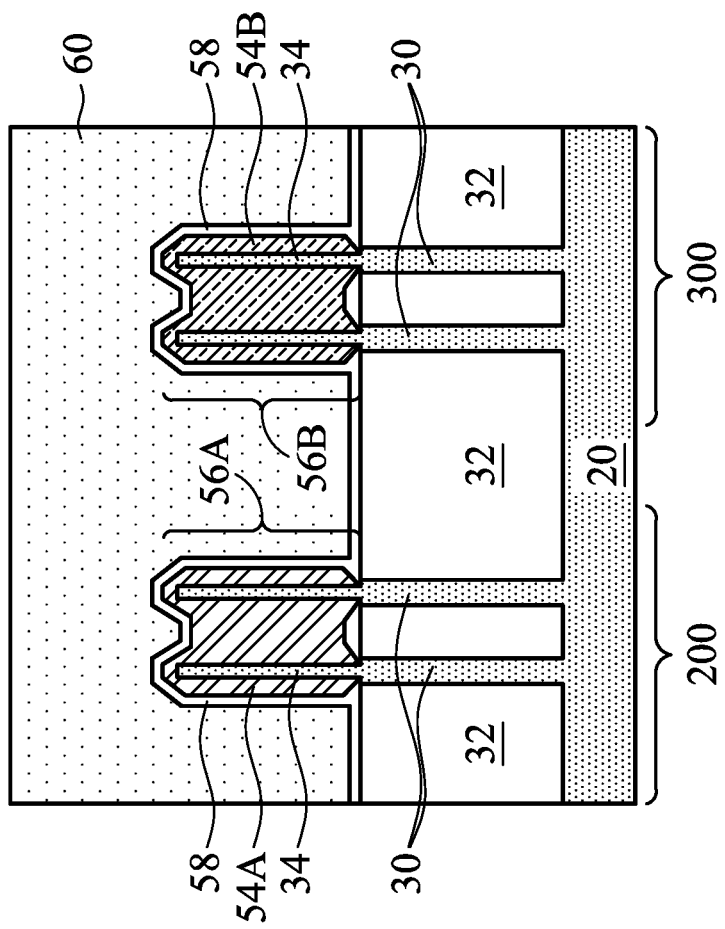
Figure 13A:
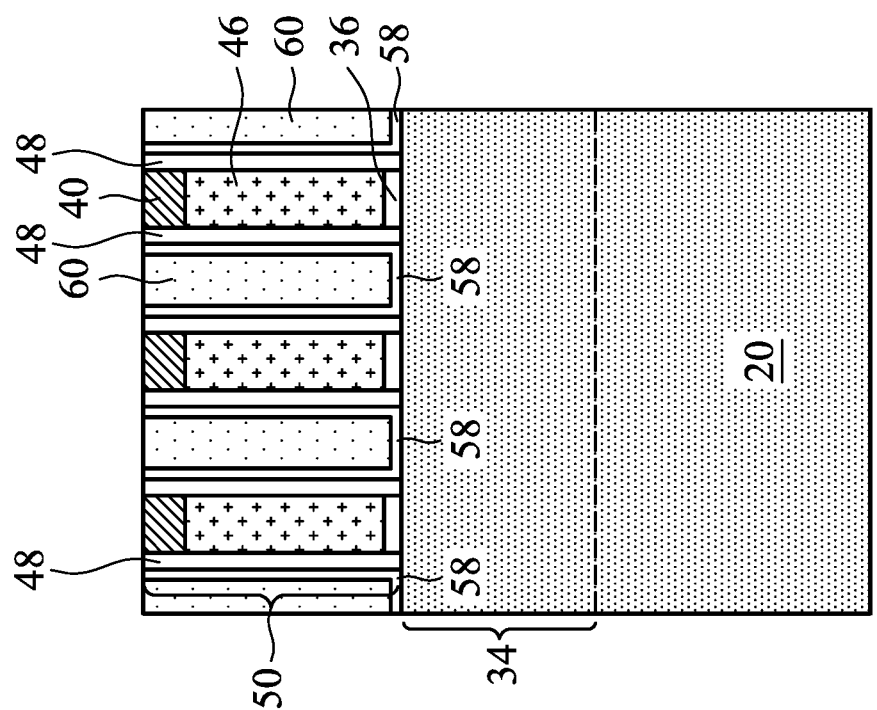

FIGS. 12A and 12B illustrate a planarization process for planarizing the top surface of semiconductor layer 60. The respective process is also illustrated as process 416 in the process flow shown in FIG. 29. Next, as shown in FIGS. 13A and 13B, a further planarization is performed until hard masks 42 (FIG. 12A) are removed, and the planarization stops on the top surfaces of hard masks 40.

Figure 14B:
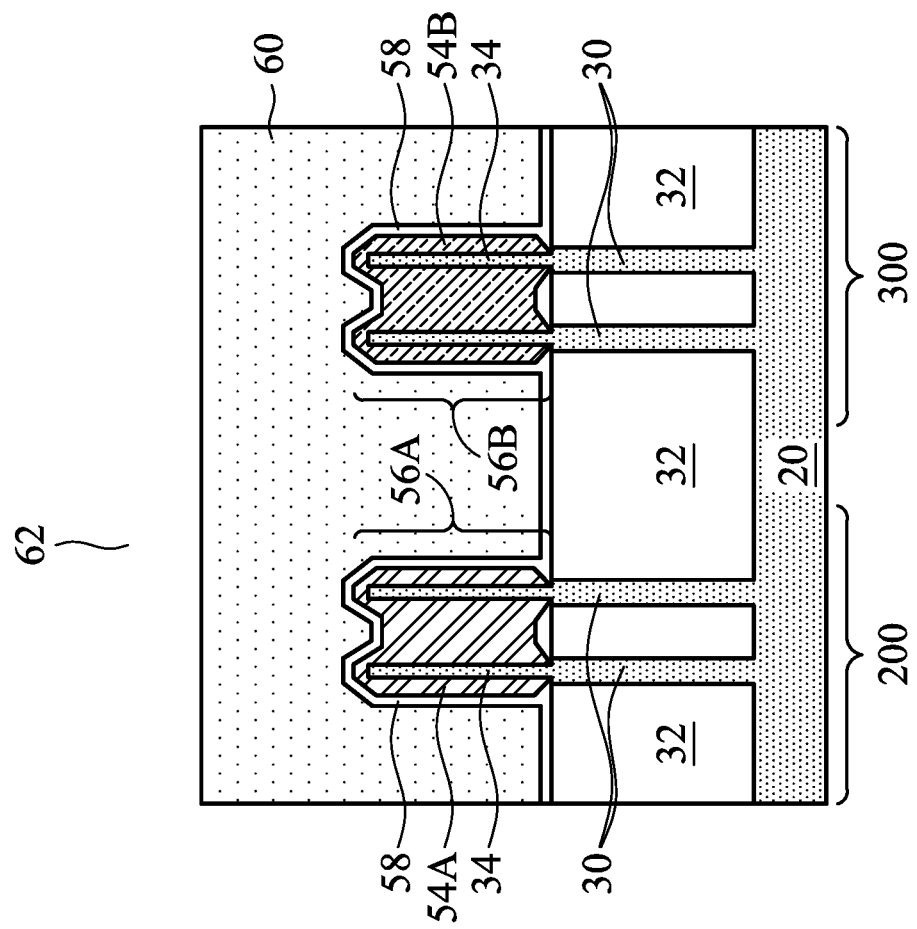
Figure 14A:
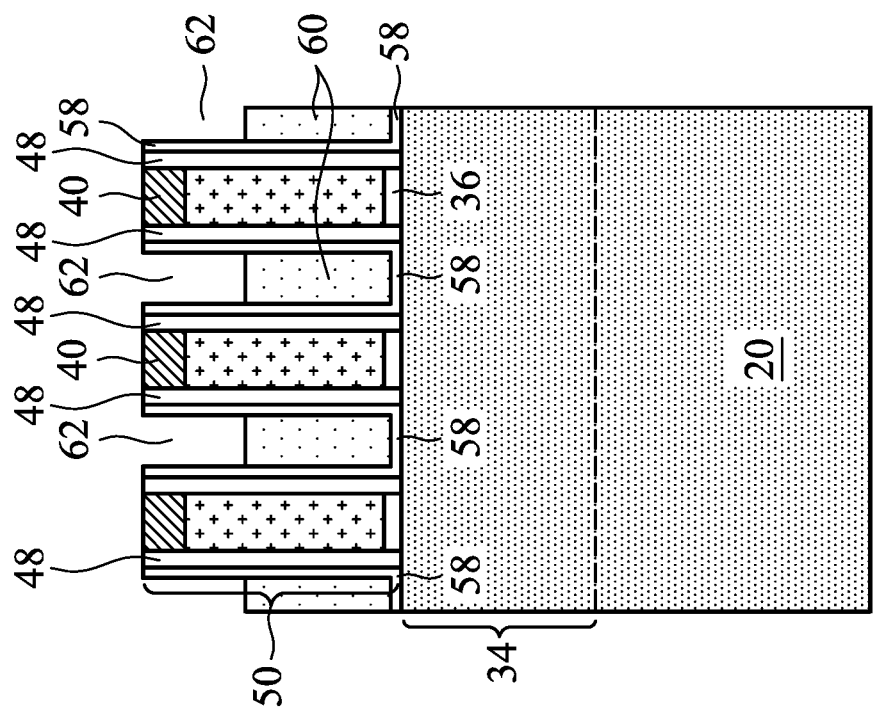

Next, an etch-back is performed to lower the top surface of semiconductor layer 60, and hence recesses 62 are formed between gate stacks 50, as shown in FIGS. 14A and 14B. The respective process is illustrated as process 418 in the process flow shown in FIG. 29. Recesses 62 are then filled with protection layer 64, which is show in FIGS. 15A and 15B. The formation process includes filling recesses 62 with a material first, which may be oxide, silicon carbo-nitride, silicon oxy-carbo-nitride, or the like. In accordance with some exemplary embodiments, the formation process includes depositing a silicon oxide layer using ALD, and then depositing another silicon oxide layer using CVD. The ALD oxide layer may have a thickness in the range between about 10 nm and about 30 nm, and the CVD oxide layer may have thickness between about 50 nm and about 150 nm. After the deposition, a planarization process such as CMP or mechanical grinding is performed to level the top surface of the resulting protection layer 64 with the top surfaces of dummy gate electrodes 46, so that dummy gate electrodes 46 are exposed.

Figure 15B:
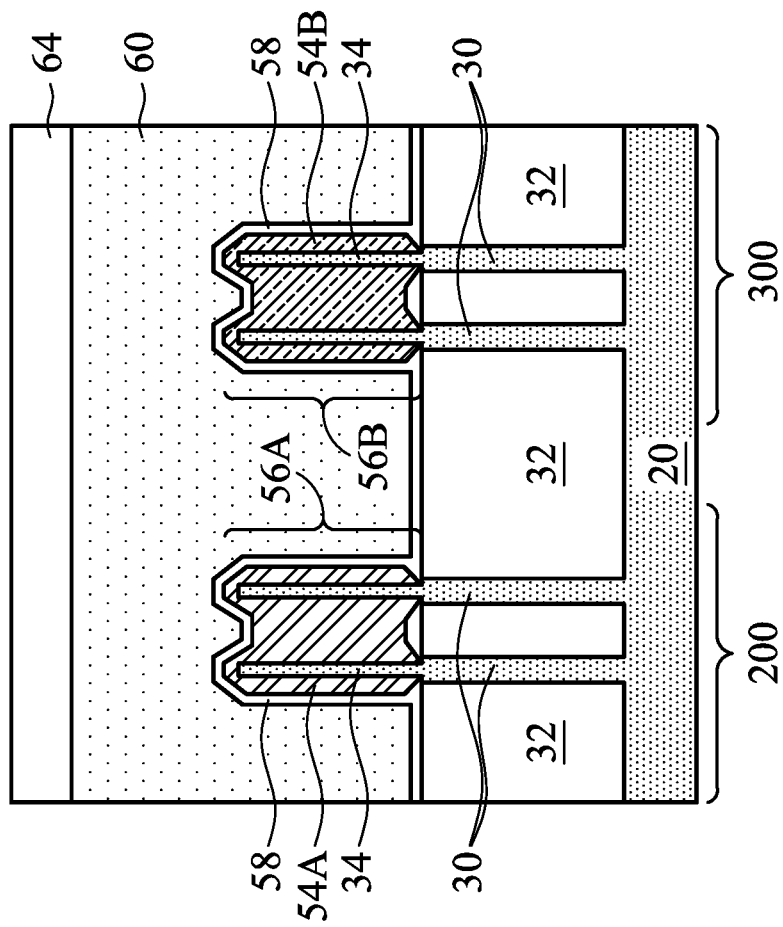
Figure 15A:
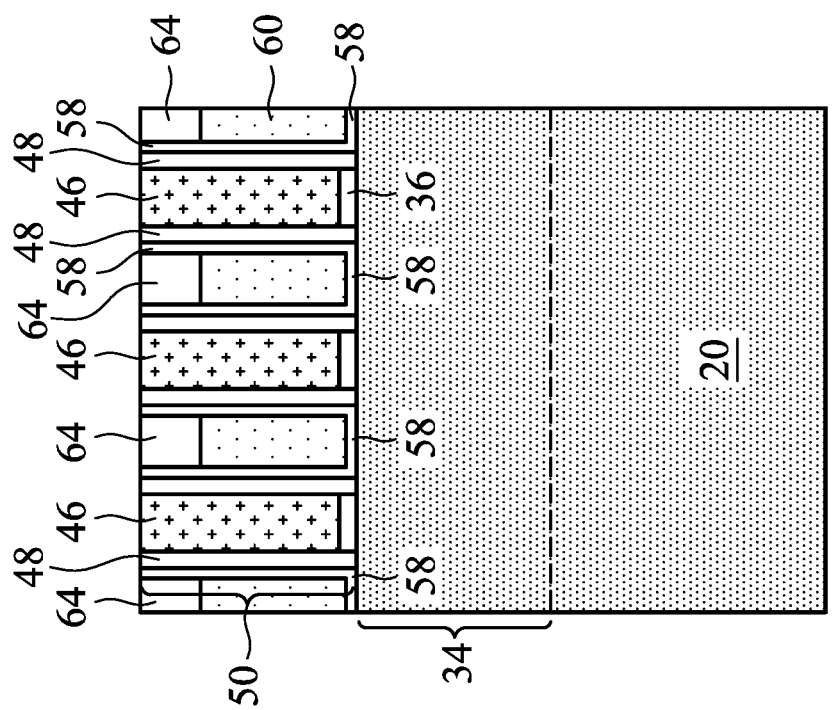
Figure 16B:
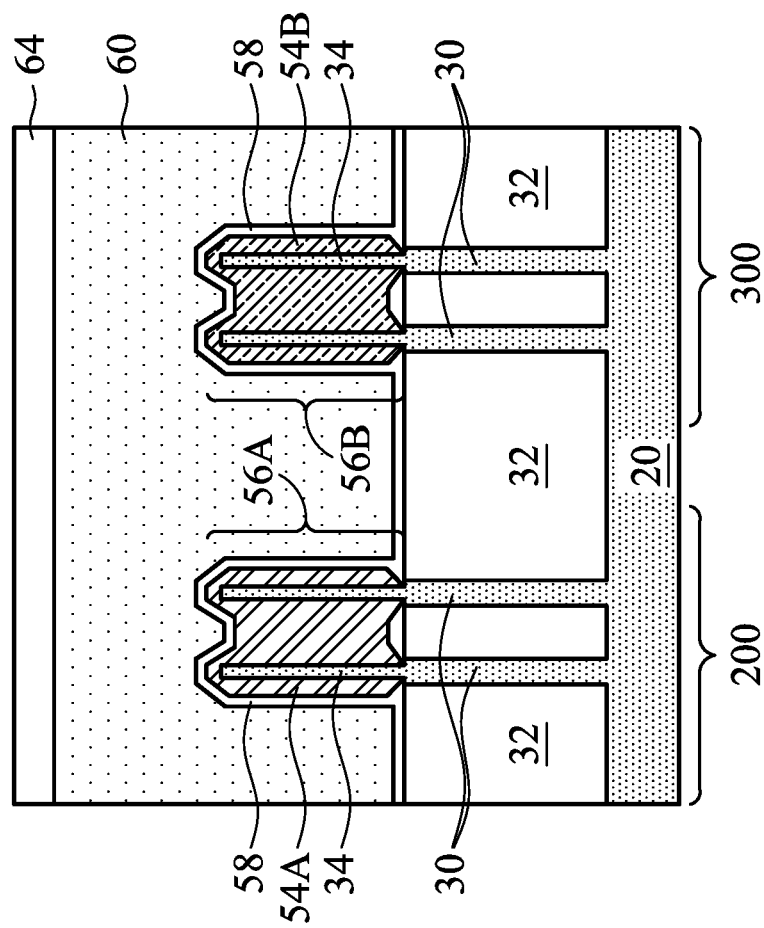
Figure 16A:
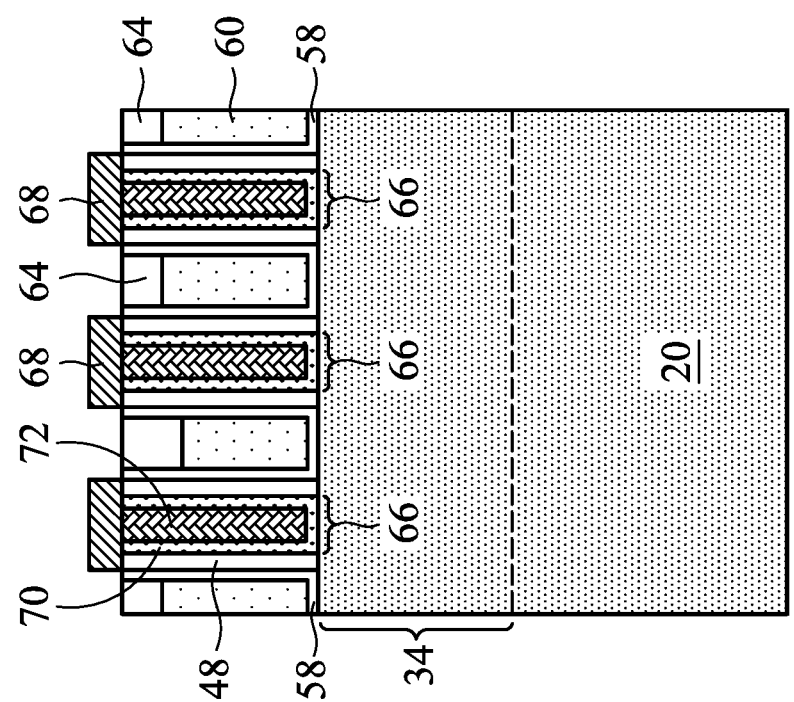

FIGS. 16A and 16B illustrate the formation of replacement gates 66 and hard masks 68. The respective process is illustrated as process 420 in the process flow shown in FIG. 29. To form the replacement gates, dummy gate electrodes 46 and dummy gate dielectrics 36 as shown in FIG. 15A are first etched, resulting in recesses between gate spacers 48. Replacement gates 66 are then formed in the recesses. Replacement gates 66 include gate dielectrics 70 and gate electrodes 72. In accordance with some embodiments, the formation of gate dielectric 70 includes forming an interfacial (dielectric) layer, and then forming a high-k dielectric layer on the interfacial layer. The interfacial layer may include silicon oxide formed by thermal oxidation of semiconductor fins 34. Alternatively, the interfacial layer is formed by treating the exposed surfaces of semiconductor fins 34 in a chemical solution, so that semiconductor fins 34 are oxidized to form a chemical oxide (silicon oxide). The high-k dielectric is then deposited on the interfacial layer. In accordance with some embodiments, the high-k dielectric has a k value greater than about 7.0, and may include a metal oxide or a silicate of Hf, Al, Zr, La, and the like.

Replacement gate electrodes 72 are formed over replacement gate dielectric 70. Replacement gate electrode 72 may include a metal-containing material such as TiN, TaN, TaC, Co, Ru, Al, Cu, W, combinations thereof, or multi-layers thereof. After the formation of gate dielectric 70 and gate electrode 72, a planarization such as CMP is performed to remove excess portions of the gate dielectric and gate electrode over protection layer 64.

As also shown in FIG. 16A, hard masks 68 are formed. In accordance with some embodiments of the present disclosure, hard masks 68 are formed through selective dielectric deposition. For example, hard masks 68 may be formed of silicon nitride, which are selectively deposited on replacement gates 66 and gate spacers 48, and not on protection layer 64, which may be formed of silicon oxide, for example. The selective deposition is achieved through the difference between the materials of protection layer 64 and other materials such as 48 and 66. As a result, hard masks 68 are self-aligned to replacement gates 66 and possibly spacers 48, and not on protection layer 64. Protection layer 64 hence remains to be exposed.

Figure 17B:
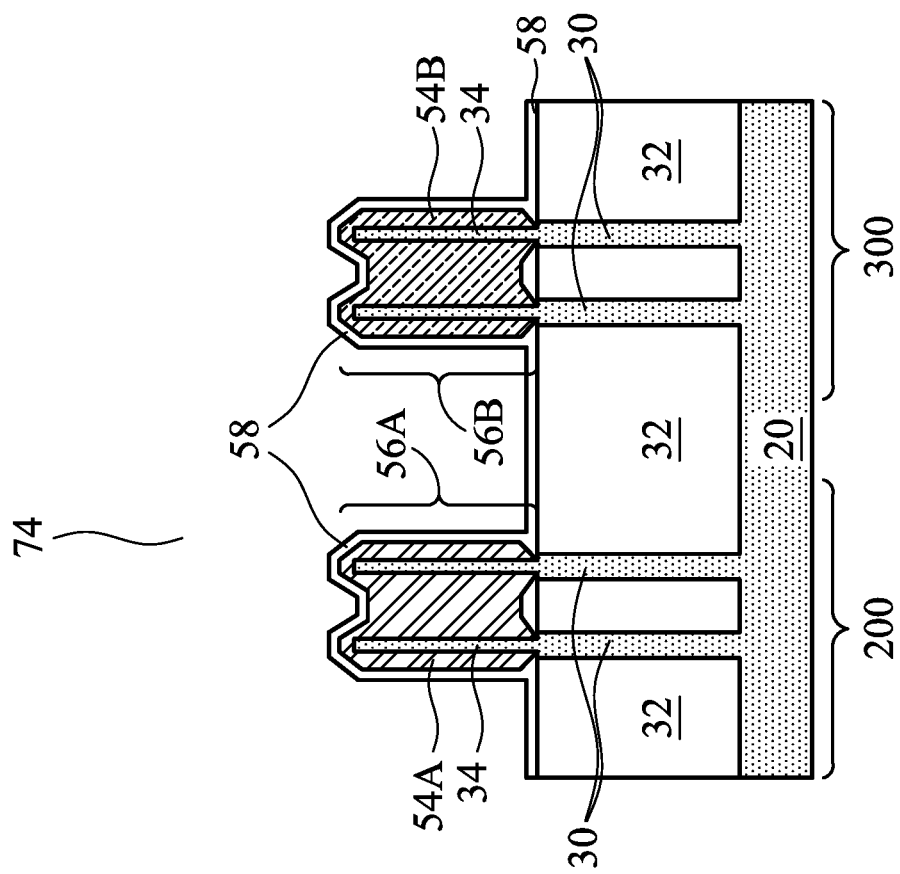
Figure 17A:
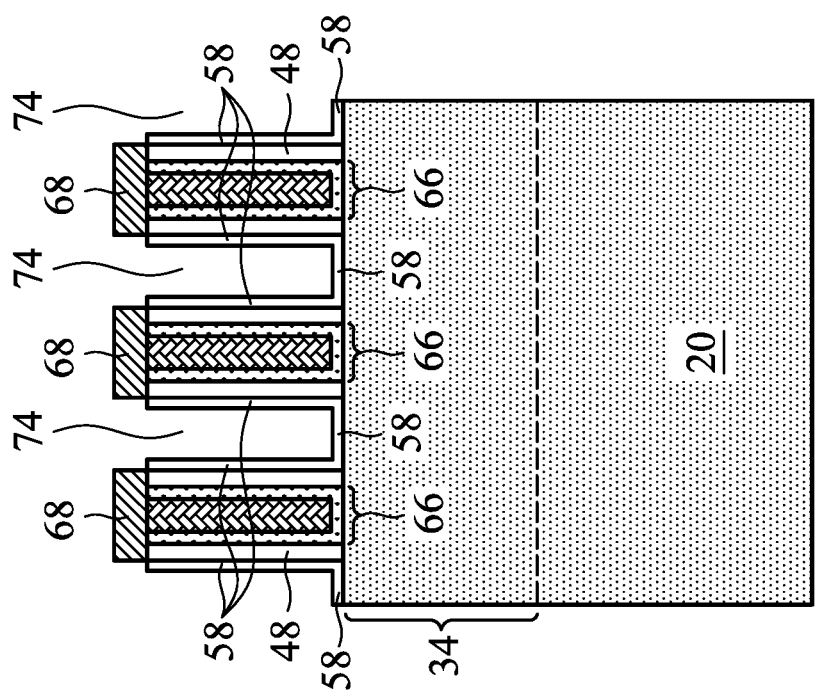

Protection layer 64 and the underlying semiconductor layer 60 are then etched, resulting in the recesses 74 as shown in FIGS. 17A and 17B. In accordance with some embodiments of the present disclosure, all parts of semiconductor layer 60 are removed, and semiconductor layer 60 is used as a sacrificial layer in the preceding process. The respective process is illustrated as process 422 in the process flow shown in FIG. 29. It is advantageous to use semiconductor material such as silicon and/or germanium to form protection layer 60 since silicon and/or germanium has a high etching selectivity over the materials of gate spacers 48 and oxide layer 58. Hence, in the removal of semiconductor layer 60, the damage to gate spacers 48 and oxide layer 58 is minimized. As a comparison, if the actual Inter-Dielectric Layer (ILD) (such as ILD 82 as shown in FIGS. 20A and 20B) was used in FIGS. 11A and 11B, since ILD 82 and gate spacers 48 have smaller etching selectivity, gate spacers 48 may be damaged in the preceding processes.

Figure 18A:
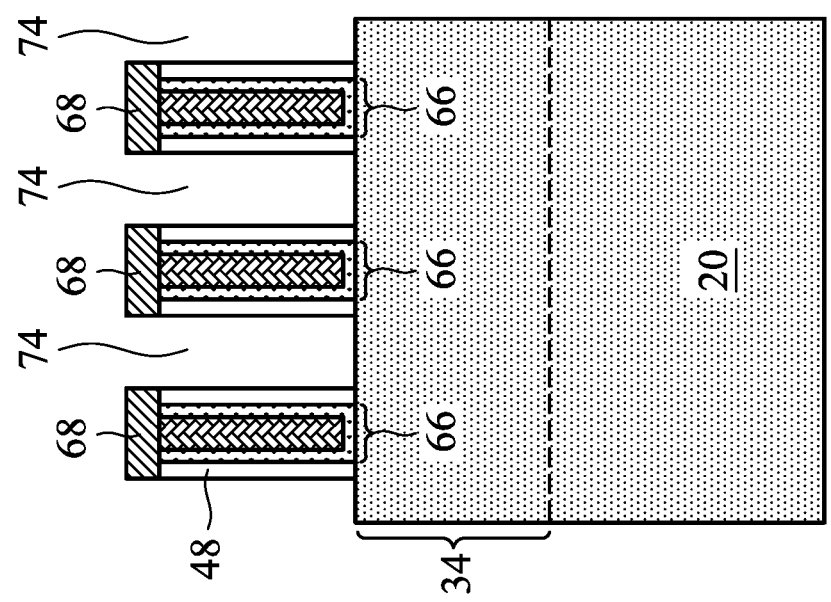
Figure 18B:
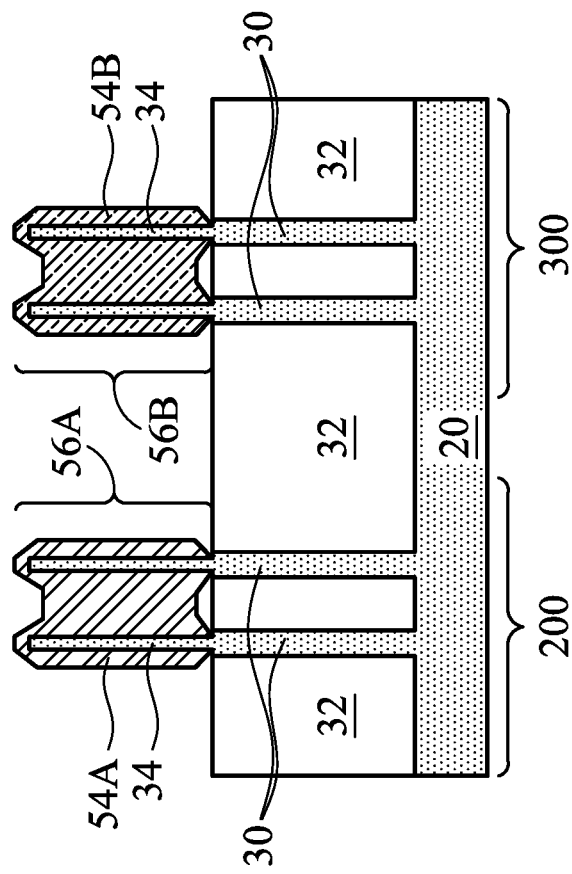

Oxide layer 58 as shown in FIGS. 17A and 17B is then etched, and the resulting structure is shown in Figure FIGS. 18A and 18B, respectively. The etching may be performed using, for example, a mixture of $NF_3$ and $NH_3$ gases, a mixture of HF and $NH_3$ gases, or a solution of HF.

Figure 19B:
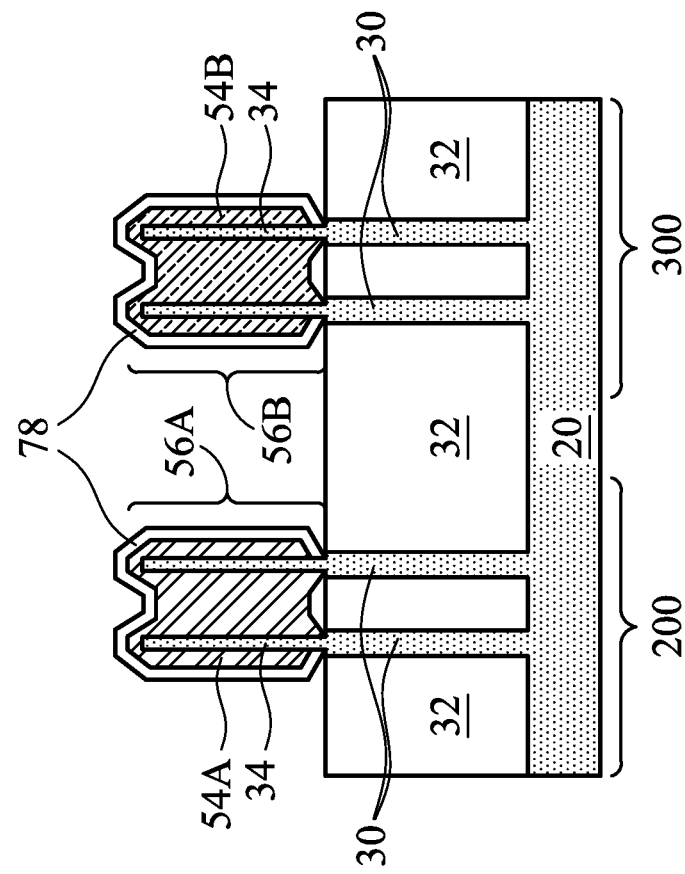
Figure 19A:
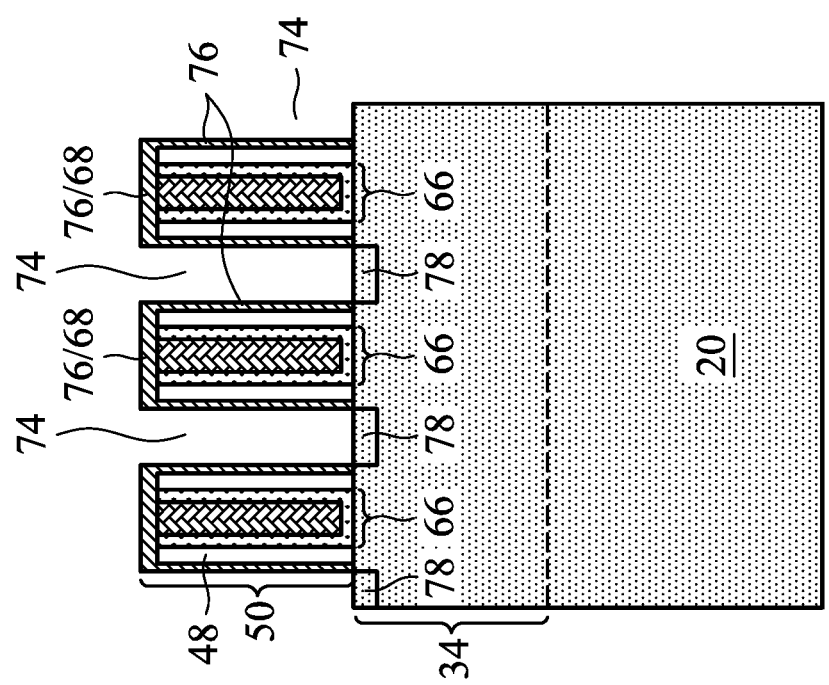

FIG. 19A illustrates the formation of additional gate spacers 76 and silicide layers 78. In accordance with some exemplary embodiments, an oxide layer (not shown) is formed on the exposed surfaces of source/drain regions 56A and 56B, for example, through thermal oxidation. Additional gate spacers 76 are then formed through selective dielectric deposition. Since the selective dielectric deposition results in gate spacers 76 to be prohibited (and hence will not grow) on oxide, the dielectric material of gate spacers 76 would not be formed on the oxide layer (not shown) on source/drain regions 56A and 56B. The same material for forming gate spacers 76 may also be formed on hard masks.

Next, the oxide layer (not shown) on source/drain regions 56A and 56B is etched. Silicide layers 78 are then formed. In accordance with some embodiments of the present disclosure, a metal layer (not shown), which may be a titanium layer, a nickel layer, a cobalt layer, or the like, is deposited as a blanket layer. Next, an anneal (which may be rapid thermal anneal) is performed to react the bottom portion of the metal layer with the surface portions of source/drain regions 56 to form silicide layer 78. The unreacted portions of the metal layer may then be removed, resulting in the structure shown in FIGS. 19A and 19B. During these process processes, hard masks 68 and gate spacers 76 may become thinner, as shown in FIG. 19A.

FIGS. 20A and 20B illustrate the formation of etch stop layer 80 and ILD 82. Etch stop layer 80 may be formed of silicon oxide, silicon nitride, silicon carbide, silicon oxynitride, silicon carbo-nitride, or the like, and may be formed using a deposition method such as CVD, ALD, or the like. ILD 82 may include a material selected from Phospho-Silicate Glass (PSG), Boro-Silicate Glass (GSG), Boron-doped Phospho-Silicate Glass (BPSG), Fluorine-doped Silicon Glass (FSG), TEOS oxide, or PECVD oxide (which may include $SiO_2$). ILD 82 may be formed using spin-on coating, FCVD, or the like, or formed using a deposition method such as PECVD or Low Pressure Chemical Vapor Deposition (LPCVD).

ILD 82 and etch stop layer 80 may be etched to form contact openings. The boundaries of the exemplary contact openings are represented using dashed lines 84. The etching may be performed using, for example, Reactive Ion Etch (RIE). Some portions of silicide layers 78 are exposed to the contact openings. In a subsequent process, source/drain contact plugs (not shown) are formed in the contact openings. The formation of the contact plugs may include forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may include tungsten.

FIGS. 21 through 28 illustrate the cross-sectional views of intermediate stages in a gap-filling process, with a semiconductor material (such as silicon) filled into trenches in accordance with some embodiments. The respective process flow is shown as flow 500 in FIG. 30. FIG. 21 illustrates strips 110 protruding higher than the top surface of base structure 120. Strips 110, when viewed from top, are long strips, and the plane shown in FIG. 21 is perpendicular to the lengthwise directions of strips 110. Dielectric layer 112 is formed on the sidewalls and the top surfaces of strips 110. Dielectric layer 112 may be formed as a conformal layer, and the thickness T1 of the horizontal portions and thickness T2 of the vertical portions are close to each other, for example, with a difference smaller than about 20 percent of thickness T1. Dielectric layer 112 may or may not include horizontal portions on top of base structure 120, and hence these portions of dielectric layer 112 are illustrated using dashed lines to indicate they may or may not exist. Trenches 114 are between strips 110. In accordance with some embodiments of the present disclosure, the aspect ratio (the ratio of depth to width) of trenches 114 is greater than 5, and may be in the range between about 5 and about 18.

Figure 26:
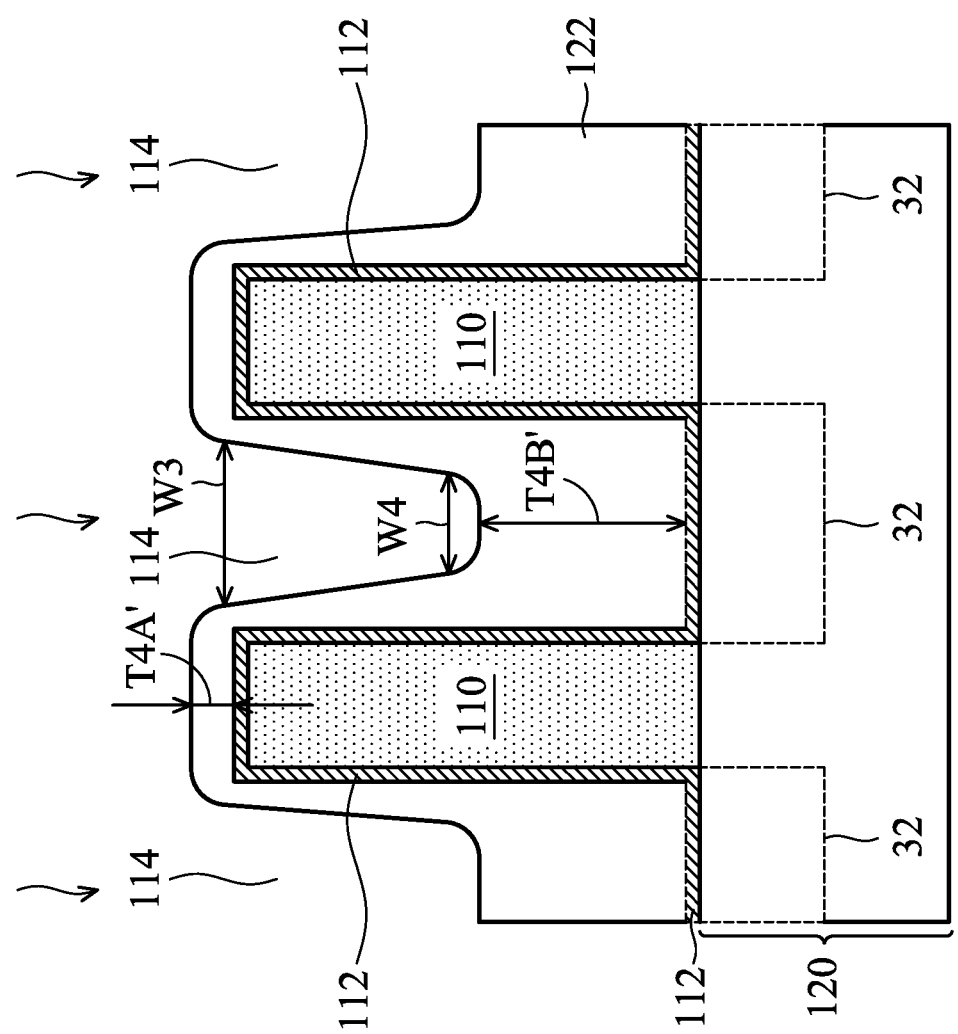
Figure 27:
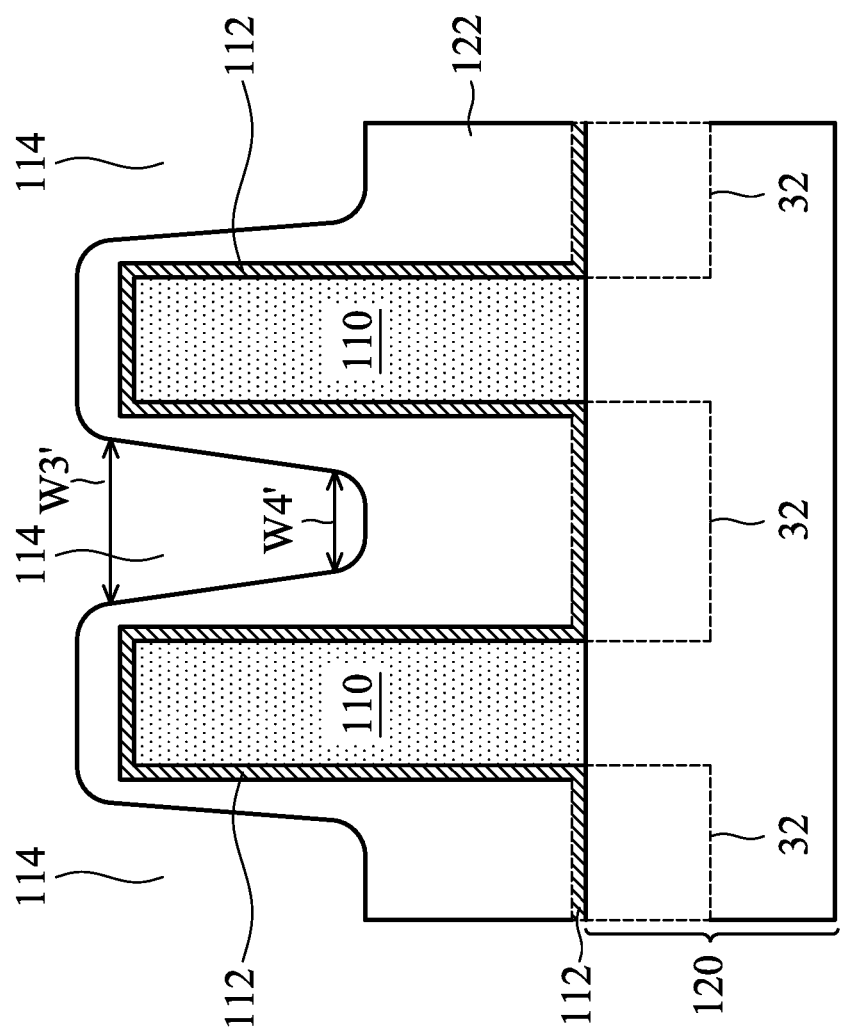
Figure 28:
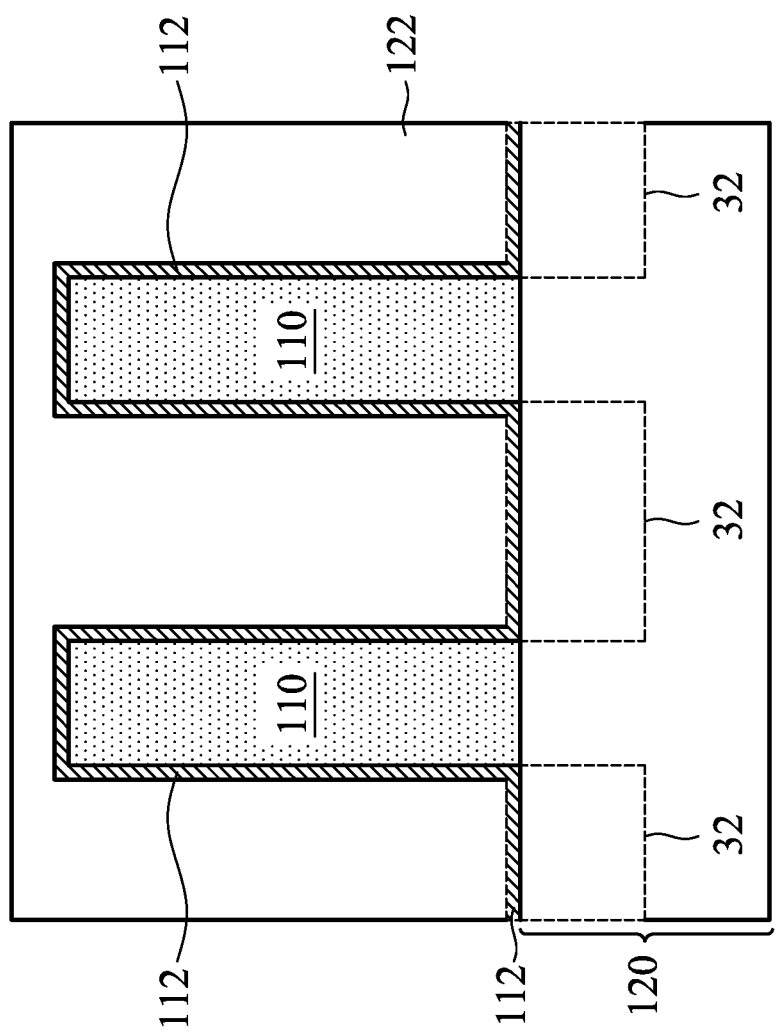

In accordance with some embodiments of the present disclosure, the gap-filling process as shown in FIGS. 21 through 28 is used to form dummy gate electrode layer 38 as shown in FIG. 7. Accordingly, the processes shown in FIGS. 21 through 28 correspond to process 408 in FIG. 29. Strips 110 in FIG. 21 correspond to semiconductor fins 34 in FIG. 7. Dielectric layer 112 corresponding to dummy gate dielectric 36 in FIG. 7. Base structure 120 correspond to STI regions 32, bulk substrate 20, and semiconductor strips 30 in FIG. 7. The resulting semiconductor material 122 as shown in FIG. 28 corresponds to dummy gate electrode layer 38 in FIG. 7.

In accordance with alternative embodiments of the present disclosure, the gap-filling process as shown in FIGS. 21 through 28 is used to form semiconductor layer 60 as shown in FIGS. 11A and 11B. The process shown in FIGS. 21 through 28 thus corresponds to process 418 in FIG. 29. Accordingly, strips 110 in FIG. 21 correspond to gate stacks 50 and gate spacers 48 in FIG. 11A. Dielectric layer 112 corresponding to oxide layer 58 as in FIGS. 11A and 11B. Base structure 120 corresponds to fin 34 and substrate 20 as shown in FIGS. 11A and 11B. The resulting semiconductor material 122 as shown in FIG. 28 corresponds to semiconductor layer 60 in FIGS. 11A and 11B.

Figure 22:
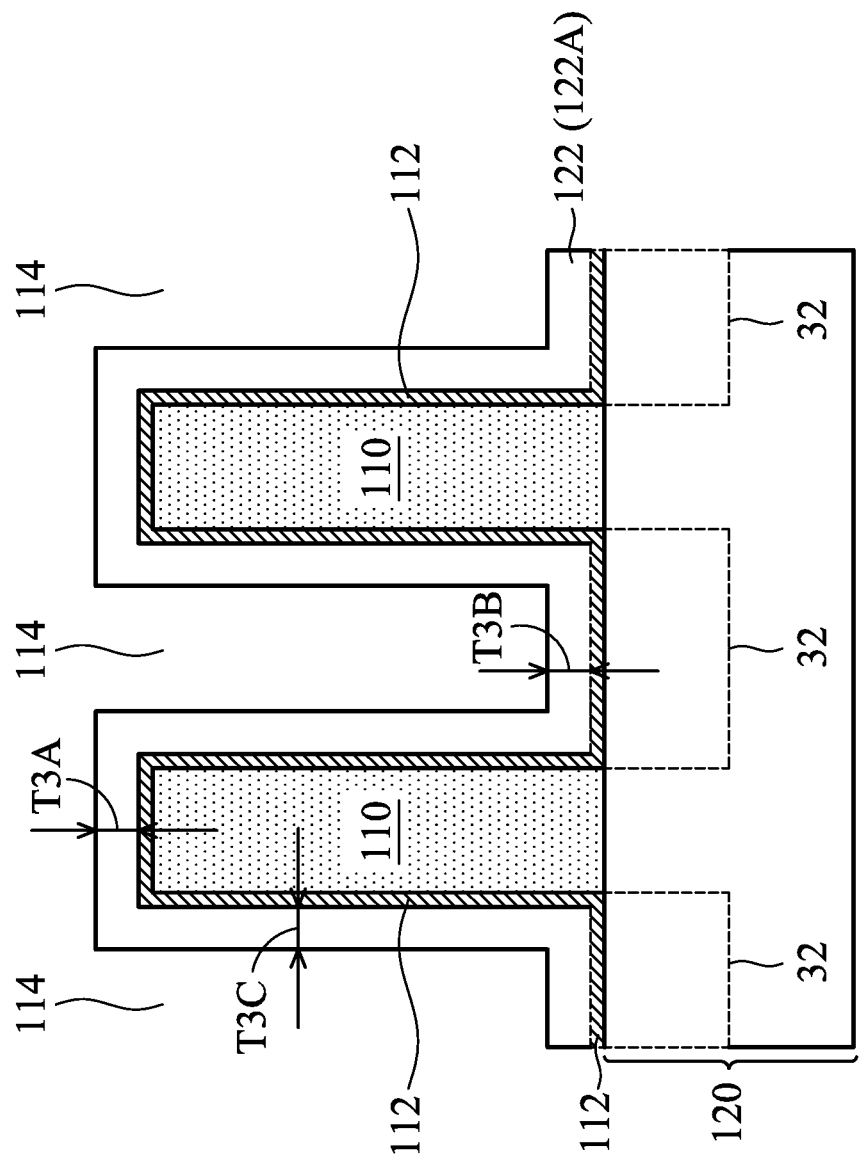
Figure 30:
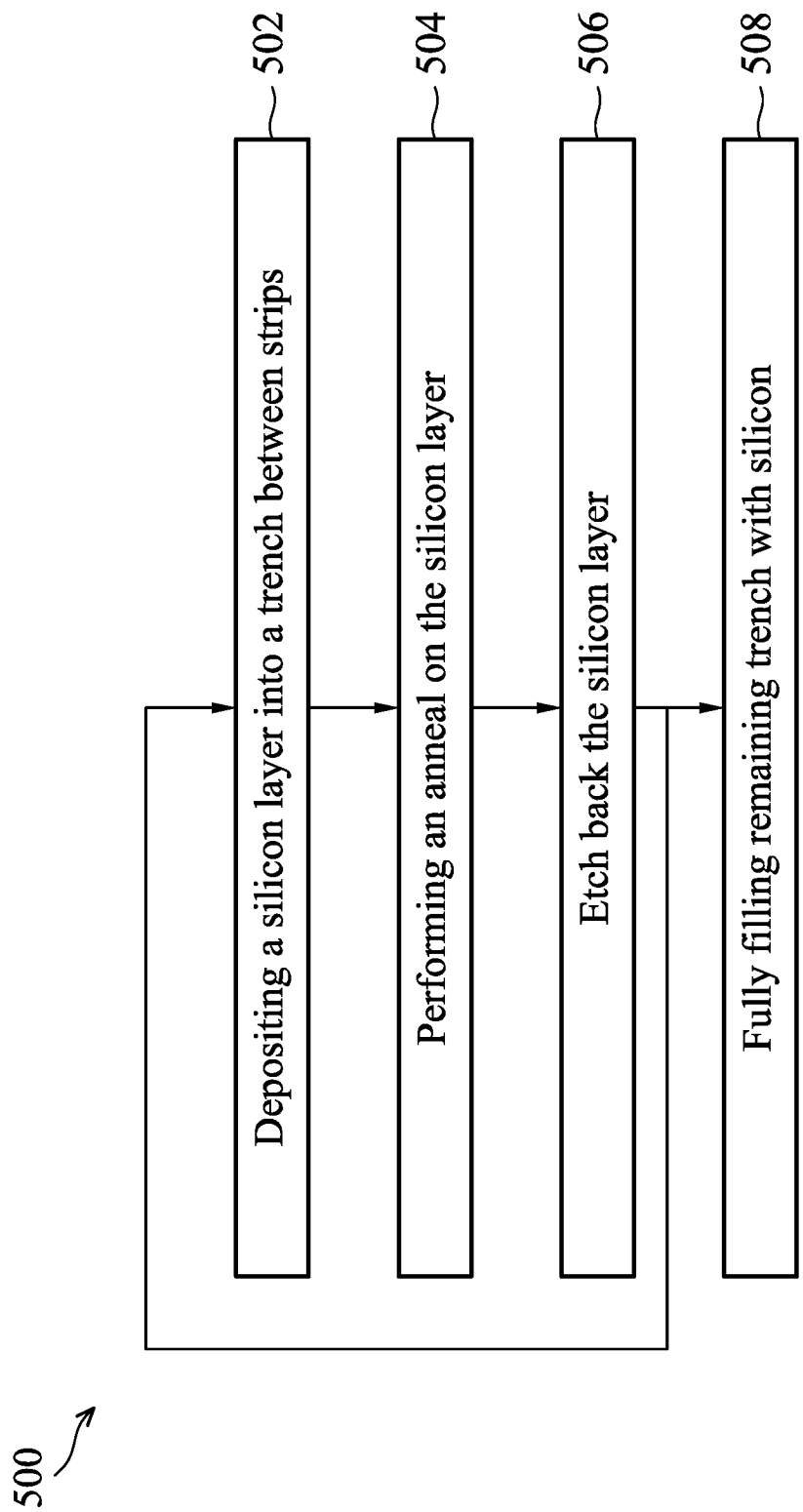
FIG. 30 illustrates a process flow of a gap-filling process in accordance with some embodiments.

Referring to FIG. 22, semiconductor layer 122 (also marked as 122A) is deposited. The respective process is illustrated as process 502 in the process flow 500 as shown in FIG. 30. In accordance with some embodiments of the present disclosure, semiconductor layer 122 is a silicon layer, and hence is referred to as silicon layer 122 hereinafter. It is appreciated that although silicon layer 122 is used as an example, the gap-filling method as discussed in the present disclosure may apply to the gap-filling of trenches with other semiconductor materials whenever applicable.

Silicon layer 122 may be deposited using a conformal deposition method, which may be LPCVD, ALD, CVD, or the like. The formation may include depositing a silicon seed layer, and then growing more silicon on the silicon seed layer. In accordance with some embodiments of the present disclosure, the silicon seed layer is deposited using a silicon-containing precursor such as $SiH_3$—$N((CH—CH_3)_2)_2$. Silicon layer 122 may be free from other elements such as germanium, n-type impurities (such as phosphorous and arsenic), and p-type impurities (such as boron and indium), or may include some of these elements. After the formation of the silicon seed layer, silicon may be grown on the seed layer using a silicon-containing precursor such as disilane ($Si_2H_6$), monosilane ($SiH_4$), or the mixture of disilane and monosilane. The temperature for growing the silicon layer using disilane may be in the range between about 300° C. and about 450° C. The temperature for growing the silicon layer using monosilane may be in the range between about 400° C. and about 600° C. Depending on the temperature, the growth rate of silicon layer 122, and other process conditions, silicon layer 122 may be an amorphous silicon layer or a polysilicon layer. The thickness T3 (including T3A and T3B) and T3C of silicon layer 122 may be in the range between about 20 Å and about 200 Å. Silicon layer 122 may be formed as a conformal layer, and the thickness T3A and T3B of horizontal portions and thickness T3C of vertical portions are close to each other, for example, with a difference smaller than about 20 percent of thickness T3A, T3B, and T3C.

Figure 23:
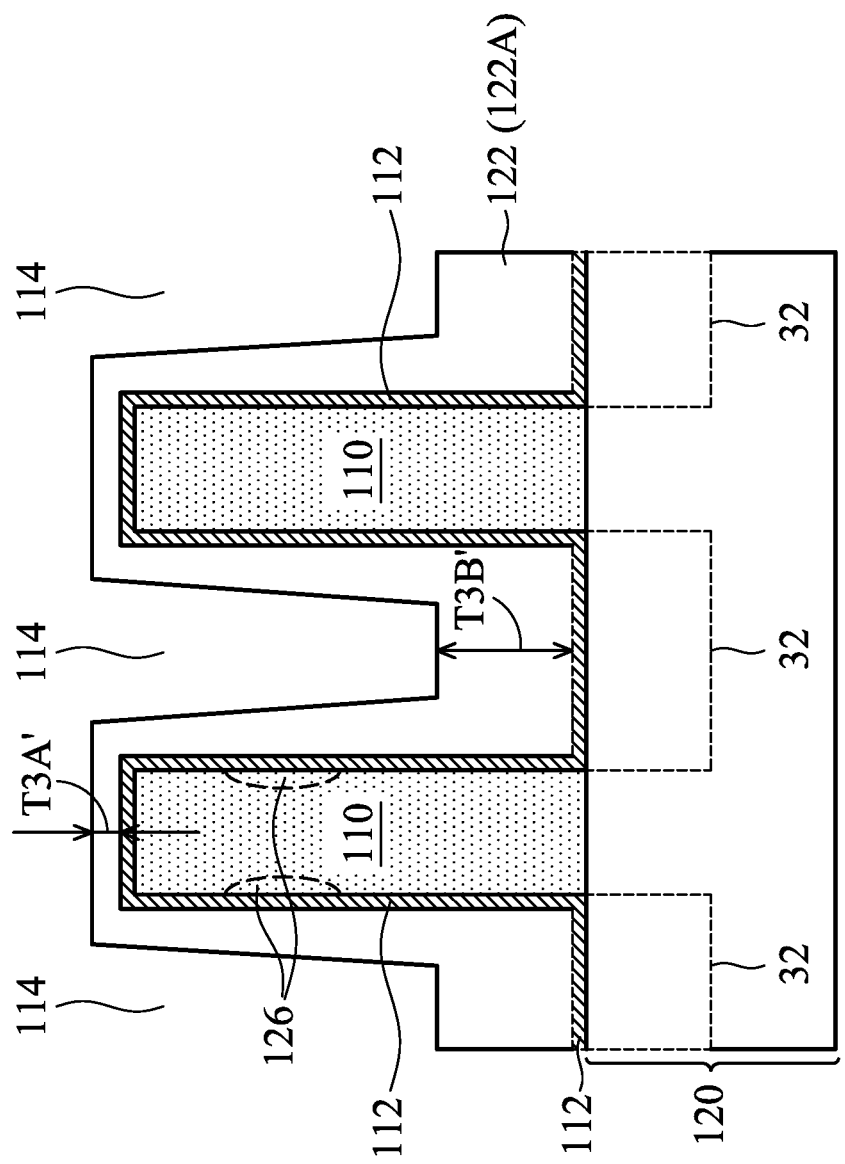

After the deposition of silicon layer 122, an anneal is performed. The respective process is illustrated as process 504 in the process flow shown in FIG. 30. In accordance with alternative embodiments, the anneal is skipped. The resulting structure after the anneal is schematically shown in FIG. 23. In accordance with some embodiments of the present disclosure, the anneal is performed at a temperature in the range between about 450° C. and about 600° C. The anneal may last between about 2 minutes and about 2 hours, depending on the temperature, with a higher temperature corresponding to a shorter anneal time, and a lower temperature corresponding to a longer anneal time. During the anneal, process gases such as nitrogen ($N_2$) or hydrogen ($H_2$) may be introduced.

As a result of the anneal, silicon migrate from the illustrated higher places (e.g. fin top) to lower places (e.g. trench bottom). For example, the thickness T3B (FIG. 22) of the portions of silicon layer 122 at the bottom of trenches 114 is increased to thickness T3B' as shown in FIG. 23. Difference (T3B'−T3B) may be greater than about 5 Å, and may be in the range between about 5 Å and about 100 Å. Ratio (T3B'−T3B)/T3B may also be greater than about 25 percent, and may be in the range between about 25 percent and about 200 percent. On the other hand, thickness T3A (FIG. 22) of the portions of silicon layer 122 at the top of strips 110 is reduced to thickness T3A' as shown in FIG. 23. Difference (T3A−T3A') may be greater than about 5 Å, and may be in the range between about 5 Å and about 100 Å. Ratio (T3A−T3A')/T3A may also be greater than about 25 percent, and may be in the range between about 25 percent and about 75 percent. One of the possible reasons causing the migration of the silicon atoms may involve the anneal breaking hydrogen atoms (coming from the precursors) from silicon atoms. Then, the silicon atoms having the dangling bonds tend to migrate to the places with higher surface energies or lower potential, and eventually reduce the total system energy by filling the trench. The atoms with the dangling bonds are then bonded with other atoms. The migration of silicon atoms from higher places to lower places is similar to the reflow of silicon, although at the anneal temperature, silicon is neither molten nor partially molten.

The migration of silicon results in a bottom-up effect, that is, more silicon migrates to the bottom of trenches, which is equivalent to growing silicon in a bottom-up way. The increased amount of silicon at the bottom of trenches 114 results in more support to the lower parts of strips 110, and less silicon is attached to the top parts of strips 110. Accordingly, the bending of strips 110 due to the force applied during silicon deposition is reduced. In reality, strips 110 may not be perfectly straight, and may have necking portions. The necking portions of strips 110 are illustrated schematically using dashed lines 126 in FIG. 23. In the conformal deposition of silicon layer 122, the necking profile is transferred to the sidewalls of silicon layer 122. The necking portion causes difficulty in the full filling of trenches 114, and void/seam may be generated. In accordance with some embodiments of the present disclosure, the migration of silicon causes the sidewalls of silicon layer 122 to be smoothened and the necking profile (in the silicon layer 122) eliminated.

Figure 24:
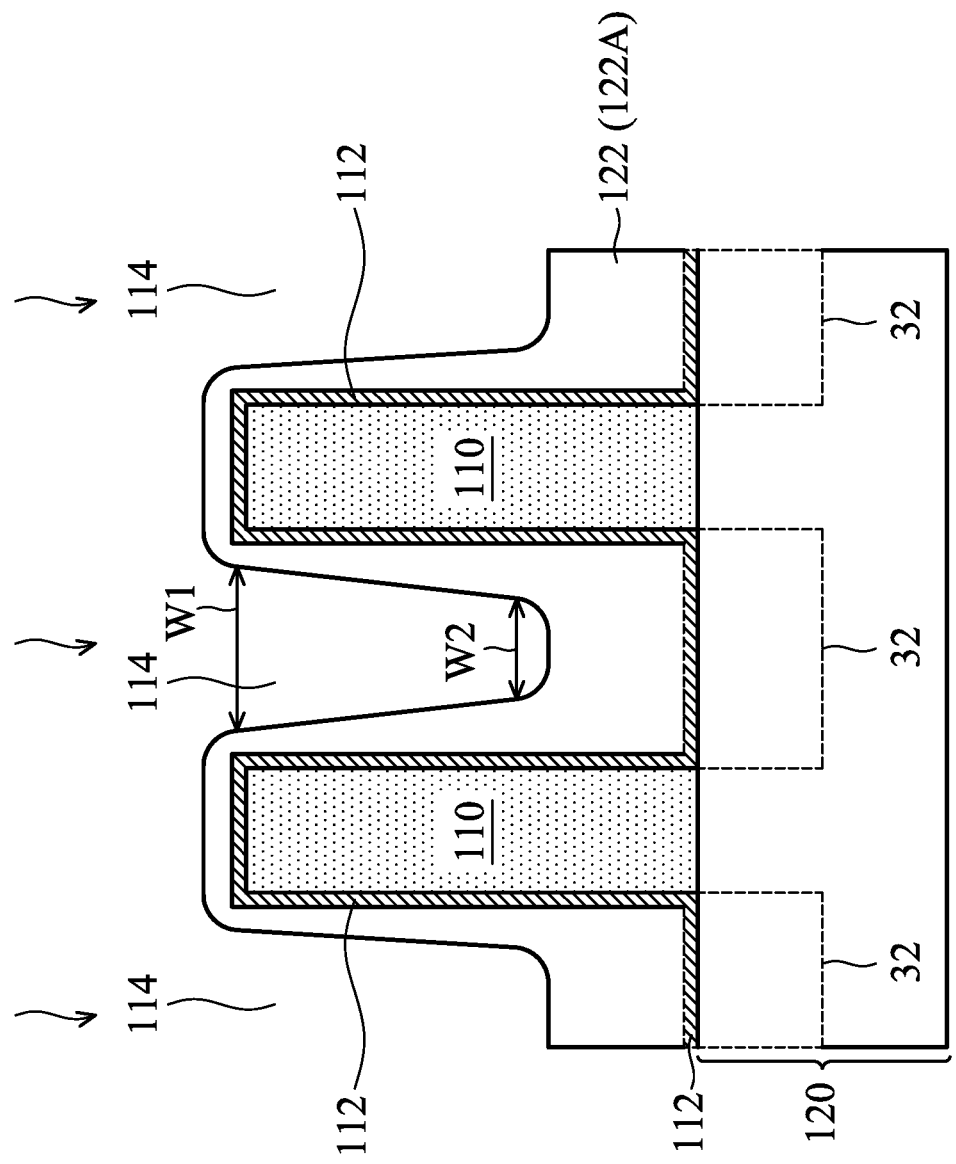

An etch-back may be performed on silicon layer 122A to form an improved trench profile (more V-shape like) for the subsequent gap-fill process, resulting in the structure shown in FIG. 24. The respective process is illustrated as process 506 in the process flow shown in FIG. 30. In accordance with alternative embodiments, the etch-back is skipped, and the process may continue with the subsequent deposition, anneal, and possibly etch-back cycles. In accordance with some embodiments of the present disclosure, the etch-back is performed using an etching gas such as HCl. In accordance with some embodiments of the present disclosure, the etch-back is isotropic (for example, without applying bias power in the etching chamber during the etch-back). The etch-back is also performed without using any etching mask to protect any portion of silicon layer 122A. As a result of the etch-back, the profile of silicon layer 122A are more rounded. This results in the rounding of corners of silicon layer 122A and the removal of overhangs, if any. Furthermore, due to the high aspect ratio of trenches 114, the upper portions of silicon layer 122A are etched more than the lower portions. This causes the upper width W1 of trench 114 to be enlarged more than the lower width W2. Accordingly, not only the aspect ratio of the remaining trenches 114 is reduced, the sidewalls of the remaining trenches 114 are more tilted. The increase in width W1 reduces the possibility of the merging of the top portions silicon layer 122A. The merging of the top portions of silicon layer 122A may adversely cause the top portions of strips 110 wrapped by the merged portions to bend toward each other, and hence seam or void may be formed, causing process difficulty in subsequent processes. For example, the bending-induced etch shadow may cause the increase in the un-wanted residue.

The process processes shown in FIGS. 22, 23, and 24 are in combination referred to as a deposition-anneal-etch cycle. In accordance with some embodiments of the present disclosure, one or more deposition-anneal-etch cycle is performed to form more silicon on the structure shown in FIG. 24. The deposition-anneal-etch cycles are shown as the looping back of processes 502, 504, and 506 in FIG. 30. In accordance with alternative embodiments of the present disclosure, the remaining trenches 114 as shown in FIG. 24 is fully filled with silicon in a deposition process without going through more deposition-anneal-etch cycles.

Figure 25:
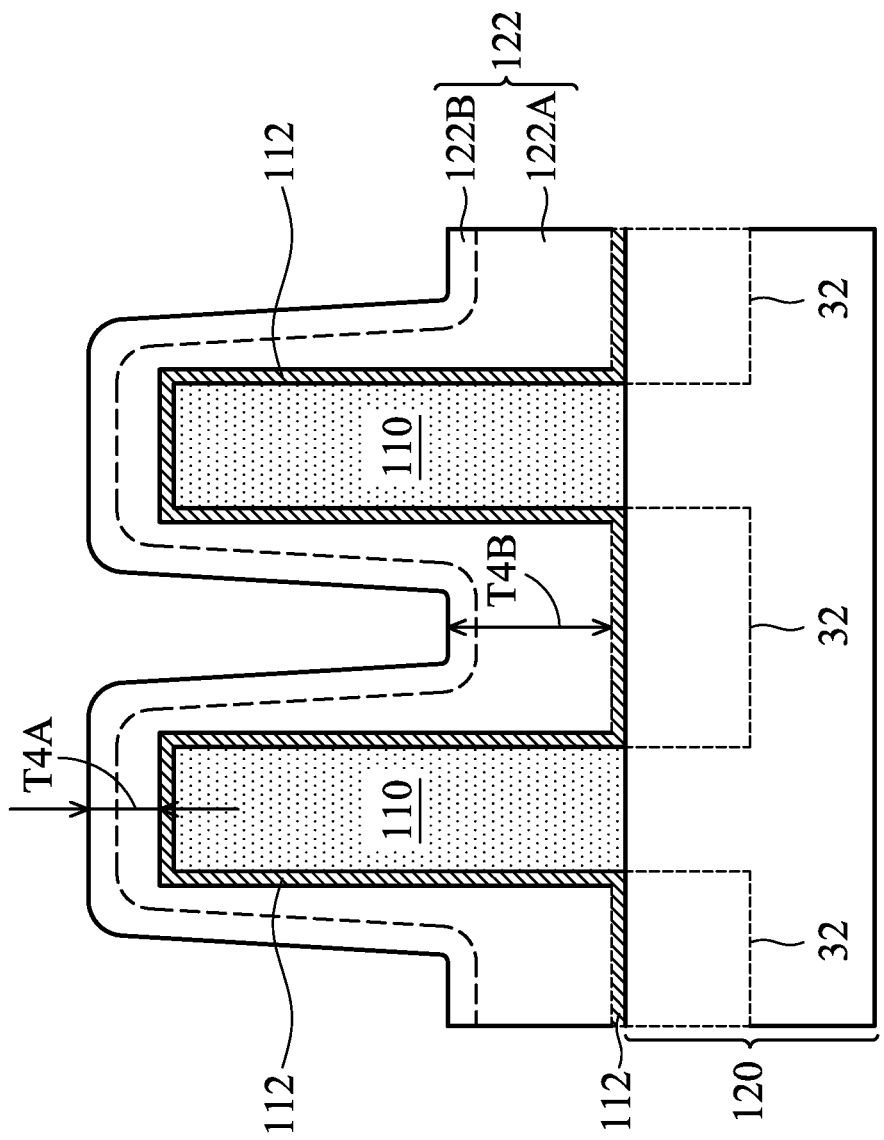

FIGS. 25, 26, and 27 illustrate an additional deposition-anneal-etch cycle. Referring to FIG. 25, an additional silicon layer, which is marked as silicon layer 122B, is deposited. Silicon layers 122A and 122B are in combination referred to as silicon layer 122. Silicon layer 122B may have the same composition, and may be formed using a method selected from the same candidate methods, as the formation of silicon layer 122A. The thickness of silicon layer 122B may also be in the range between about 20 Å and about 200 Å. Silicon layer 122B may also be a conformal layer, and hence its profile follows the profile of the surface of silicon layer 122A.

Next, as shown in FIG. 26, an anneal process is performed. The process conditions of the anneal may be similar to the process as shown in FIG. 24. As the result of the anneal process, the upper portions of silicon layer 122 migrate to lower portions. For example, thickness T4B (FIG. 25) of the portions of silicon layer 122 at the bottom of trenches 114 is increased as thickness T4B' as shown in FIG.

26. Difference (T4B'−T4B) may be greater than about 5 Å, and may be in the range between about 5 Å and about 100 Å. On the other hand, the thickness T4A (FIG. 25) of the portions of silicon layer 122 on the top of strips 110 is reduced to thickness T4A' as shown in FIG. 26. Difference (T4A−T4A') may be greater than about 5 Å, and may be in the range between about 5 Å and about 100 Å.

After the anneal, an etch-back is performed, and the resulting structure is shown in FIG. 27. The etch-back may be performed using similar process conditions as the etch-back shown in FIG. 24. The etch-back further removes the corner portions and eliminates overhangs of silicon layer 122, and causes the difference of widths W3' and W4' to be increased over the difference between widths W3 and W4 as shown in FIG. 26.

After the structure shown in FIG. 27 is formed, more deposition-anneal-etch cycles may be performed, followed by a deposition to fully fill trenches 114. The respective process is illustrated as process 508 in the process flow shown in FIG. 30. Alternatively, a deposition is performed to fully fill trenches 114 without going through more deposition-anneal-etch cycles. A planarization process such as CMP or mechanical grinding is then performed, and the resulting structure is shown in FIG. 28. The remaining filling material may be similar to, or may be slightly different from, the previously filled silicon layers 122A and 122B (FIG. 25).

In the above-discussed exemplary cycles, each cycle may include a deposition process, an anneal process, and an etch-back process. In accordance with some embodiments, any of the cycles may include a deposition and an anneal, but not the etch-back, or a deposition and an etch-back, but not the anneal in any combination. Accordingly, a plurality of cycles may be performed, with some of cycles including deposition, an anneal, and etch-back, some including deposition and anneal (without etch-back), and others including deposition and etch-back (without anneal).

As a result of the process processes as show in FIGS. 21 through 28, the dummy gate electrode layer 38 (FIG. 7) and/or semiconductor layer 60 (FIG. 11A/11B) may be formed, and may be filled into high-aspect-ratio trenches without generating voids and seams and bending.

The embodiments of the present disclosure have some advantageous features. By performing deposition-anneal-etch cycles, trenches may be filled without generating voids and seams and bending.

In accordance with some embodiments of the present disclosure, a method includes depositing a first silicon layer, wherein the first silicon layer comprises first portions over a plurality of strips, and second portions filled into trenches between the plurality of strips, and the plurality of strips protrudes higher than a base structure; performing a first anneal to allow parts of the first portions of the first silicon layer to migrate toward lower parts of the plurality of trenches; and performing a first etching on the first silicon layer to remove some portions of the first silicon layer. In an embodiment, the method further includes depositing a second silicon layer on the first silicon layer; performing a second anneal to anneal the first silicon layer and the second silicon layer; and performing a second etching on the first silicon layer and the second silicon layer. In an embodiment, the plurality of strips comprises a plurality of dummy gate stacks, and the method further comprises: forming a dielectric layer on the plurality of dummy gate stacks, with the first silicon layer being deposited on the dielectric layer; and removing the first silicon layer and the second silicon layer. In an embodiment, the method further includes removing the plurality of dummy gate stacks to form recesses; and forming replacement gates in the recesses, with the first silicon layer and the second silicon layer removed after the replacement gates are formed. In an embodiment, the method further includes removing the dielectric layer. In an embodiment, the plurality of strips comprises a plurality of semiconductor fins, and the method further comprises forming a dummy gate dielectric layer on the plurality of semiconductor fins, with the first silicon layer being deposited on the dummy gate dielectric layer. In an embodiment, the method further includes patterning the first silicon layer, the second silicon layer, and the dummy gate dielectric layer to form a dummy gate stack. In an embodiment, the first anneal is performed at a temperature between about 450° C. and about 600° C.

In accordance with some embodiments of the present disclosure, a method includes forming source/drain regions on a plurality of semiconductor fins, wherein the plurality of semiconductor fins is between a plurality of dummy gate stacks; forming a dielectric layer on the source/drain regions and the plurality of dummy gate stacks; performing a first deposition-anneal-etching cycle to form a first semiconductor layer over the dielectric layer, with the first semiconductor layer partially filling trenches between the plurality of dummy gate stacks; fully filling the trenches with a semiconductor material, wherein the semiconductor material is over the first semiconductor layer; planarizing the semiconductor material, until the plurality of dummy gate stacks is exposed; replacing the plurality of dummy gate stacks with replacement gates; and removing remaining portions of the semiconductor material and the first semiconductor layer. In an embodiment, the method further includes before the semiconductor material is filled, performing a second deposition-anneal-etching cycle to form a second semiconductor layer over the first semiconductor layer. In an embodiment, the first deposition-anneal-etching cycle comprises: depositing the first semiconductor layer as a conformal layer; annealing the first semiconductor layer; and etching the first semiconductor layer to remove some portions of the first semiconductor layer. In an embodiment, in the annealing, upper portions of the first semiconductor layer migrate to lower parts of the trenches. In an embodiment, the annealing is performed at a temperature between about 450° C. and about 600° C. In an embodiment, the annealing results in a thickness of a top portion of the first semiconductor layer on top of one of the plurality of dummy gate stacks to be reduced by more than about 25 percent.

In accordance with some embodiments of the present disclosure, a method includes performing a plurality of deposition-anneal-etch cycles to stack a plurality of silicon layers, with the plurality of silicon layers comprising first portions over a plurality of dummy gate stacks, and second portions partially filling trenches between the plurality of dummy gate stacks, and the plurality of dummy gate stacks protrude over isolation regions, wherein each of the plurality of deposition-anneal-etch cycles comprises: depositing a silicon layer; performing an anneal on the silicon layer; and performing an etching to partially remove the annealed silicon layer; and filling remaining portions of the trenches with silicon. In an embodiment, the method further includes performing a planarization on the plurality of silicon layers and the plurality of silicon layers. In an embodiment, during the anneal, thicknesses of higher portions and lower portions of the silicon layer are changed. In an embodiment, the method further includes, performing a silicon-removal process to fully remove the plurality of silicon layers and the silicon over the plurality of silicon layers. In an embodiment, the method further includes, before the silicon-removal process, replacing the plurality of dummy gate stacks with replacement gates. In an embodiment, the method further includes, after the silicon-removal process, forming an inter-layer dielectric into spaces left by the removed plurality of silicon layers and the removed silicon over the plurality of silicon layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a plurality of strips over a base structure, with trenches formed between the plurality of strips;
performing a first deposition process to deposit a first semiconductor layer, wherein the first semiconductor layer partially fills the trenches, and wherein the first semiconductor layer comprises first portions over the plurality of strips, and second portions on first sidewalls of the plurality of strips; and
performing a first annealing process, wherein after the first annealing process, second sidewalls of the second portions of the plurality of strips are more slanted, wherein the second sidewalls are exposed to the trenches.

2. The method of claim 1 further comprising performing a first etching process on the first semiconductor layer to remove some portions of the first semiconductor layer.

3. The method of claim 2, wherein the first etching process is performed after the first annealing process.

4. The method of claim 1, wherein the first deposition process comprises depositing a silicon layer.

5. The method of claim 4, wherein the plurality of strips comprise a plurality of dummy gate stacks, and the method further comprises:
forming a dielectric layer on the plurality of dummy gate stacks, with the first semiconductor layer being deposited on the dielectric layer; and
fully removing the first semiconductor layer from the trenches.

6. The method of claim 1 further comprising:
performing a second deposition process to deposit a second semiconductor layer on the first semiconductor layer; and
performing a second annealing process to anneal the first semiconductor layer and the second semiconductor layer.

7. The method of claim 6 further comprising:
after the second deposition process, performing a second etching process on the second semiconductor layer.

8. A method comprising:
forming a dielectric layer on a plurality of dummy gate stacks;
filling trenches between the plurality of dummy gate stacks with a semiconductor material, wherein the filling the trenches comprises:
performing a first deposition-anneal cycle to form a first semiconductor layer over the dielectric layer, wherein the first semiconductor layer partially fills the trenches, and the first semiconductor layer is a first part of the semiconductor material; and
removing the semiconductor material.

9. The method of claim 8 further comprising performing a second deposition-anneal cycle to form a second semiconductor layer over the first semiconductor layer, wherein the second semiconductor layer is a second part of the semiconductor material.

10. The method of claim 9 further comprising partially etching the first semiconductor layer before the second deposition-anneal cycle.

11. The method of claim 9, wherein a first annealing process in the first deposition-anneal cycle results in bottom portions of the first semiconductor layer at bottoms of the trenches to be thicker.

12. The method of claim 9, wherein a first annealing process in the first deposition-anneal cycle results in a sidewall of a part of the first semiconductor layer to be more slanted, and the part of the first semiconductor layer is on a sidewall of one of the plurality of dummy gate stacks.

13. The method of claim 8, wherein the trenches are fully filled by the first deposition-anneal cycle and at least an additional deposition-anneal cycle.

14. The method of claim 13 further comprising, after the trenches are fully filled, performing an etching process to remove the semiconductor material in the trenches.

15. The method of claim 14, wherein in the etching process, entireties of the semiconductor material inside the trenches are removed.

16. The method of claim 8, wherein the semiconductor material comprises silicon.

17. The method of claim 8, wherein in the removing the semiconductor material, all of the semiconductor material in the trenches are fully removed.

18. The method of claim 8, wherein after the first deposition-anneal cycle, portions of the semiconductor material are directly over the plurality of dummy gate stacks.

19. The method of claim 8 further comprising, at a time after the first deposition-anneal cycle, removing the dielectric layer.

20. The method of claim 8, wherein in the first deposition-anneal cycle, the semiconductor material is annealed at a temperature in a range between about 450° C. and about 600° C.

* * * * *